US012706443B2

(12) United States Patent
Okumura

(10) Patent No.: US 12,706,443 B2
(45) Date of Patent: Aug. 11, 2026

(54) OPTICAL DEVICE

(71) Applicant: Soh Okumura, Kanagawa (JP)

(72) Inventor: Soh Okumura, Kanagawa (JP)

(73) Assignee: RICOH COMPANY, LTD., Tokyo (JP)

(*) Notice: Subject to any disclaimer, the term of this patent is extended or adjusted under 35 U.S.C. 154(b) by 902 days.

(21) Appl. No.: 17/920,451

(22) PCT Filed: May 24, 2021

(86) PCT No.: PCT/IB2021/054471
§ 371 (c)(1),
(2) Date: Oct. 21, 2022

(87) PCT Pub. No.: WO2021/240334
PCT Pub. Date: Dec. 2, 2021

(65) Prior Publication Data

US 2023/0163570 A1 May 25, 2023

(30) Foreign Application Priority Data

May 29, 2020 (JP) ................................ 2020-093946
May 29, 2020 (JP) ................................ 2020-093949
(Continued)

(51) Int. Cl.
*H01S 5/183* (2006.01)
*H01S 5/06* (2006.01)
(Continued)

(52) U.S. Cl.
CPC ........ *H01S 5/18366* (2013.01); *H01S 5/0607* (2013.01); *G02B 26/0858* (2013.01);
(Continued)

(58) Field of Classification Search
CPC ............... H01S 5/18366; H01S 5/0607; H01S 5/18305; H01S 5/423; G02B 26/0858
See application file for complete search history.

(56) References Cited

U.S. PATENT DOCUMENTS

2004/0076198 A1* 4/2004 Spoonhower ....... H01S 5/18366 372/39
2016/0028207 A1* 1/2016 Cable .................. H01S 5/0071 372/20
(Continued)

FOREIGN PATENT DOCUMENTS

CN 109638644 A * 4/2019 ........... H01S 5/0607
CN 209448214 U 9/2019
(Continued)

OTHER PUBLICATIONS

Machine translation of CN 109638644 A (Year: 2019).*
(Continued)

*Primary Examiner* — Yuanda Zhang
(74) *Attorney, Agent, or Firm* — XSENSUS LLP

(57) ABSTRACT

An optical device includes a first reflector; a second reflector; an elastic support unit supporting the second reflector; a piezoelectric element on the elastic support unit; a light emitter configured to emit light having an oscillation wavelength; and circuitry configured to output a signal to apply drive voltage to the piezoelectric element to elastically deform the elastic support unit. The deformation of the elastic support unit changes a distance between the first reflector and the second reflector to change the oscillation wavelength of the light emitted from the light emitter.

20 Claims, 27 Drawing Sheets

(30) Foreign Application Priority Data

May 10, 2021 (JP) ................................ 2021-079475
May 10, 2021 (JP) ................................ 2021-079476

(51) Int. Cl.
*G02B 26/08* (2006.01)
*H01S 5/343* (2006.01)
*H01S 5/42* (2006.01)

(52) U.S. Cl.
CPC ....... *H01S 5/18305* (2013.01); *H01S 5/18311* (2013.01); *H01S 5/34313* (2013.01); *H01S 5/34353* (2013.01); *H01S 5/423* (2013.01)

(56) References Cited

U.S. PATENT DOCUMENTS

| | | | |
|---|---|---|---|
| 2017/0141538 | A1 | 5/2017 | Uchida |
| 2018/0267293 | A1 | 9/2018 | Fujishima et al. |
| 2019/0265163 | A1 | 8/2019 | Johansen |
| 2020/0271920 | A1 | 8/2020 | Hirata et al. |

FOREIGN PATENT DOCUMENTS

| | | | |
|---|---|---|---|
| CN | 110892306 | A | 3/2020 |
| EP | 0 883 220 | A2 | 12/1998 |
| EP | 3 534 468 | A1 | 9/2019 |
| EP | 3640704 | A1 | 4/2020 |
| JP | 2004-109556 | A | 4/2004 |
| JP | 2016-004155 | A | 1/2016 |
| JP | 2017-092321 | A | 5/2017 |
| JP | 2018-155816 | | 10/2018 |
| JP | 6448875 | B1 | 1/2019 |
| JP | 2019-527374 | A | 9/2019 |
| WO | WO2014/018943 | A1 | 1/2014 |

OTHER PUBLICATIONS

Office Action issued Jan. 30, 2025 in European Patent Application No. 21 729 349.7, 6 pages.

Michael C. Y. Huang, et al., "Demonstration of Piezoelectric Actuated GaAs-Based MEMS Tunable VCSEL", IEEE Photonics Technology Letters, vol. 18, No. 10, May 15, 2006, 3 pages, XP093241948.

International Search Report issued on Jul. 30, 2021 in PCT/IB2021/054471 filed on May 24, 2021, 12 pages.

Qiao Pengfei, et al., "Wavelength-Swept VCSELs", Nov. 1, 2017 (Nov. 1, 2017), vol. 23, No. 6, pp. 1-16.

Office Action issued Sep. 17, 2024 in Japanese Patent Application No. 2021-079475, 7 pages.

Office Action issued Sep. 17, 2024 in Japanese Patent Application No. 2021-079476, 7 pages.

Michael C. Y. Huang, et al ., "Monolithic Integrated Piezoelectric MEMS—Tunable VCSEL", IEEE Journal of Selected Topics in Quantum Electronics, vol. 13, No. 2, Mar./Apr. 2007, 7 pages.

Office Action issued Dec. 3, 2025 in Chinese Patent Application No. 202180037349.0, 6 pages.

Office Action issued May 31, 2026 in Chinese Patent Application No. 202180037349.0, 6 pages.

* cited by examiner

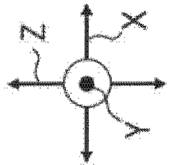
FIG. 2
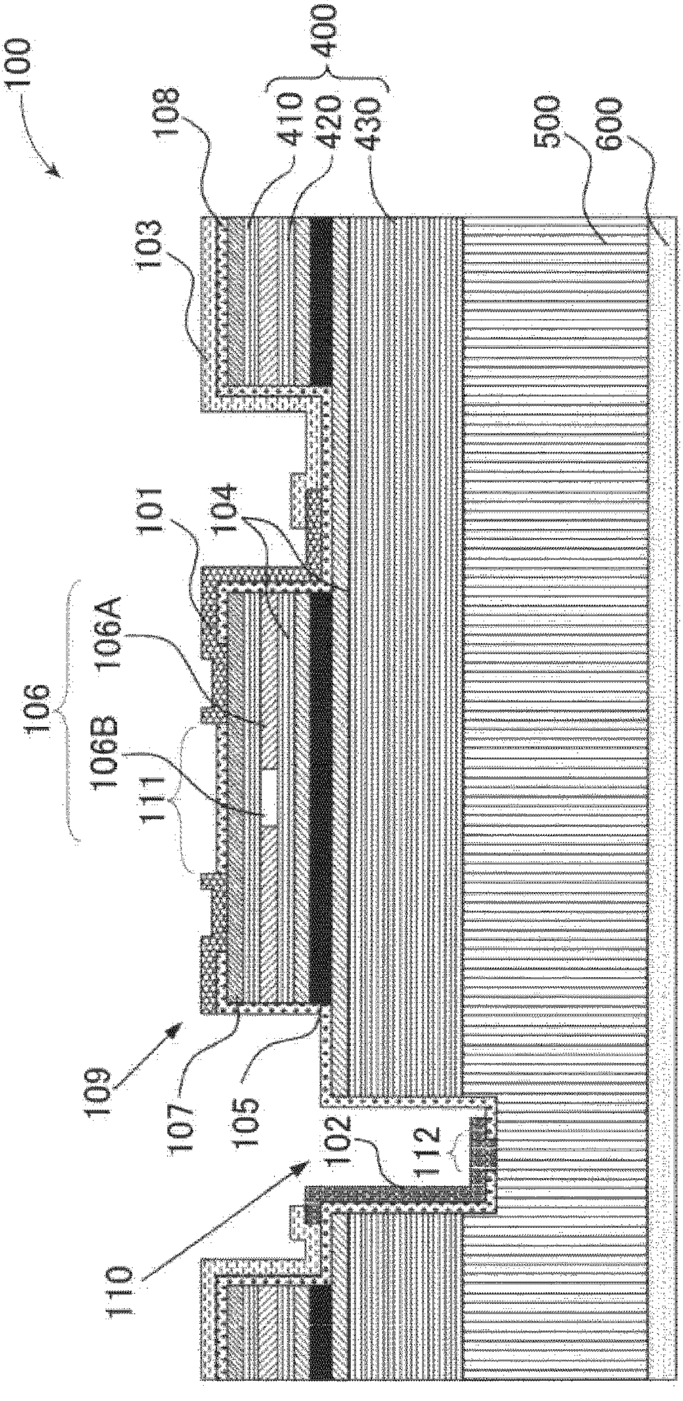

FIG. 3

200
300
700
710
720
700X
800
810
820
910
911
911A
911B
912
913
913A
913B
920
921
921A
921B
922
923
923A
923B
930
931
931A
931B
932
932A
932B
933
940
941
941A
941B
942
943
943A
943B
1011
1013
1021
1023
1031
1033
1041
1043
X
Y
Z 200
300
300
1011X
912
910
1013
1023
920
922
1021X
911
911A
911B
913
913A
913B
923
923A
923B
921
921A
921B
1011
1013X
1023X
1021
700
710
810
700X
800
820
720
X
Y
Z 10
700
300
400
500
600
Z
X
Y
100
100Z
100Y
100X
800
200
OSCILLATION LIGHT

REFLECTOR (SECOND REFLECTING MIRROR)

$l$ $\theta$ $\Delta z$

OPTICAL DEVICE

CROSS-REFERENCE TO RELATED APPLICATIONS

The present application is based on PCT filing PCT/IB2021/054471, filed May 24, 2021, which claims priorities to JP 2020-093946, JP 2020-093949, filed May 29, 2020 and JP 2021-079475, JP 2021-079476, filed May 10, 2021, the entire contents of each are incorporated herein by reference.

TECHNICAL FIELD

Embodiments of the present disclosure relate to an optical device.

BACKGROUND ART

In recent years, research on automatic driving and driving assistance systems for automobiles has progressed, and an in-vehicle radar as a sensing means has attracted attention.

In the in-vehicle radar, a frequency modulated continuous wave (FMCW) radar is widely used as a radar that can measure the distance and speed relative to an object, and as a radar that uses a heterodyne method that can detect weak reflected waves. Developments of directionality of electromagnetic wave and miniaturization of an antenna are in progress.

In these developments, research on an FMCW light detection and ranging (LiDAR), which aims to improve directionality, reduce size, and reduce power consumption by replacing electromagnetic waves with laser light, is also underway.

The light source of such an FMCW LiDAR needs to sweep wavelength with respect to time, and a micro-electromechanical systems (MEMS) tunable laser that changes the wavelength by directly modulating a cavity length is known.

For example, Japanese Patent No. 6328112 describes a tunable laser that emits tunable radiation with an output power spectrum over a radiation wavelength band having a central wavelength and an average radiated power.

This tunable laser includes a MEMS drive mechanism that includes an optical resonator provided with a first mirror and a second mirror, a gain region between the first mirror and the second mirror, a gap tuning region, and a deformable dielectric membrane mounted on a rigid support structure that is translucent over a wavelength band. The MEMS drive mechanism modulates a gap.

The MEMS drive mechanism has a membrane stress value in the range of 100 to 1000 MPa. The frequency response of the MEMS drive mechanism has substantially increased damping by the effect of squeeze film damping controlled by a central plate having a diameter greater than 50 μm and less than an actuator diameter.

A free spectral range (FSR) of the optical resonator exceeds 5% of the center wavelength. The tunable laser operates in a substantially single vertical and horizontal mode over the wavelength band.

The MEMS drive mechanism has a frequency response of wavelength tuning with a bandwidth of 6 dB over about 1 kHz.

CITATION LIST

Patent Literature

[PTL 1]
Japanese Patent No. 6328112

SUMMARY OF INVENTION

Technical Problem

Since a conventional MEMS tunable laser uses electrostatic attraction to modulate a cavity length (i.e., distance between two parallel reflecting mirrors), the linearity of a drive voltage and a displacement of the mirrors becomes insufficient to obtain a desired wavelength. Furthermore, since an initial value of the cavity length cannot be accurately adjusted to the interval of an integral multiple of an oscillation wavelength in manufacturing, undesirably, a high voltage has to be applied to a movable portion of the mirror to move the mirrors to obtain the cavity length that satisfies an oscillation condition at the time of oscillation.

It is an object of the disclosure to provide an optical device that improves the linearity of an oscillation wavelength and the drive voltage and achieves light having a desired oscillation wavelength.

Solution to Problem

An optical device according to an embodiment of the disclosed technology includes a first reflector; a second reflector; an elastic support unit supporting the second reflector; a piezoelectric element on the elastic support unit; a light emitter configured to emit light having an oscillation wavelength; and circuitry configured to output a signal to apply drive voltage to the piezoelectric element to elastically deform the elastic support unit. The deformation of the elastic support unit changes a distance between the first reflector and the second reflector to change the oscillation wavelength of the light emitted from the light emitter.

An optical device according to another embodiment of the disclosed technology includes a first reflector; a second reflector; at least three elastic support units supporting the second reflector; piezoelectric elements on the at least three elastic support units, respectively; circuitry configured to output drive signals independent of each other to the piezoelectric elements of the at least three elastic support units, respectively, to deform the at least three elastic support units elastically and independently of each other. The deformation of the at least three elastic support units changes plane parallelism between the first reflector and the second reflector.

Advantageous Effects of Invention

The embodiments of the present disclosure provide an optical device that achieves light with a desired oscillation wavelength by improving the linearity of the oscillation wavelength with respect to the drive voltage.

BRIEF DESCRIPTION OF DRAWINGS

The accompanying drawings are intended to depict example embodiments of the present invention and should not be interpreted to limit the scope thereof. The accompanying drawings are not to be considered as drawn to scale unless explicitly noted. Also, identical or similar reference numerals designate identical or similar components throughout the several views.

FIG. 2 is a diagram of an example of a detailed structure of a half-VCSEL element.

FIG. 3 is a plan view of a first example of a support structure of a second reflector.

FIG. 17 is a cross-sectional view taken along the line AA in FIG. 16.

FIG. 22 is an illustration for describing a state accompanied by an operation that applies different voltages to two connecting portions to tilt the reflector.

DESCRIPTION OF EMBODIMENTS

Figure 1:
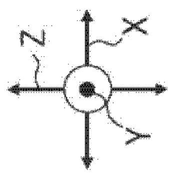
FIG. 1 is a diagram of the overall configuration of the tunable laser according to an embodiment.
Figure 1:
Figure 1:
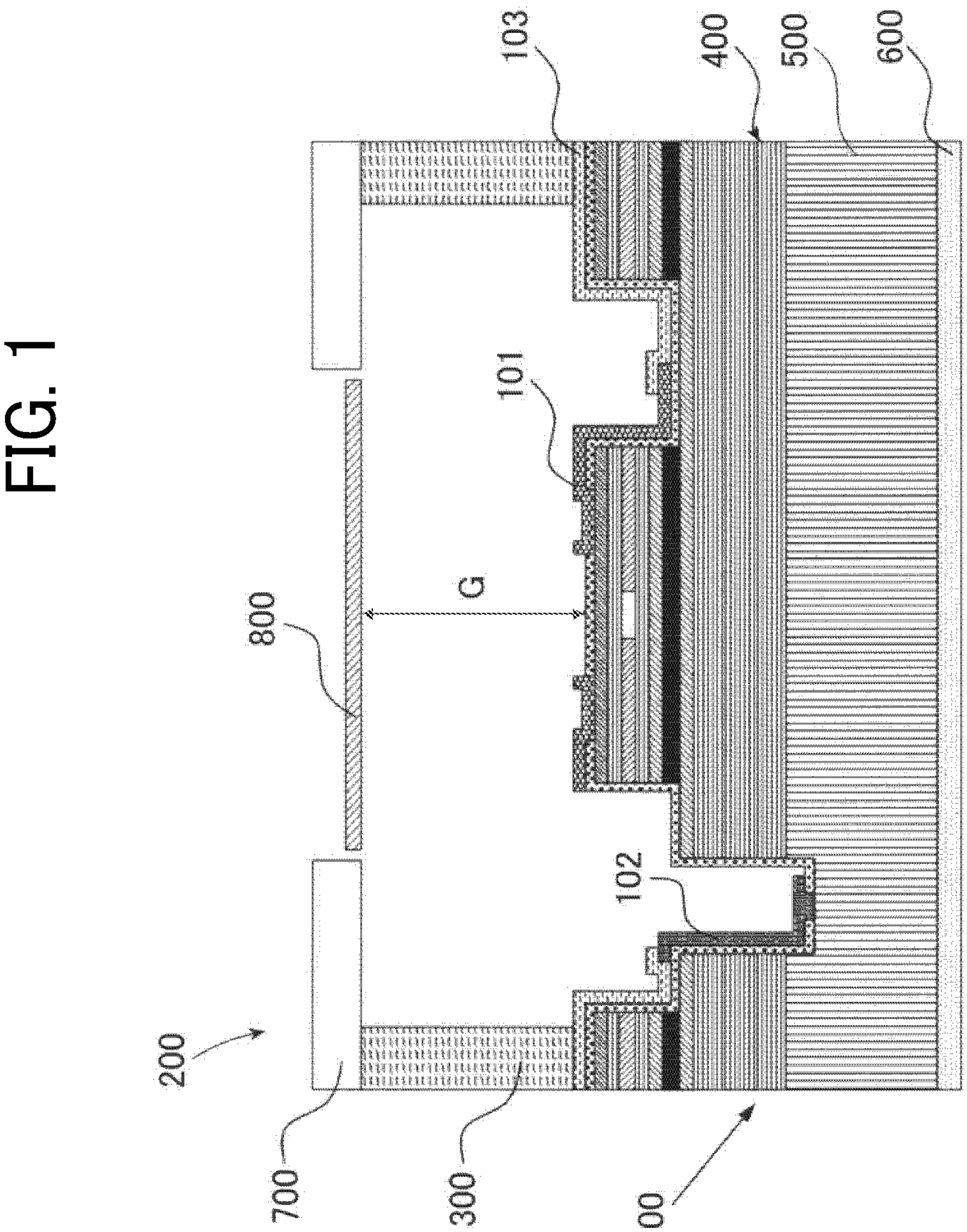

The terminology used herein is for the purpose of describing particular embodiments only and is not intended to be limiting of the present invention. As used herein, the singular forms “a”, “an” and “the” are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

An embodiment is described below referring to the drawings. Like reference signs are applied to identical or corresponding components throughout the drawings and redundant description thereof may be omitted.

The tunable laser (optical device) 10 according to the present embodiment will be described in detail with reference to FIGS. 1 to 31.

The X, Y, and Z directions in the following description are based on the arrow line directions drawn in the drawing. Notably, in the present disclosure, a “drive voltage” may be read as a “drive signal.”

FIG. 1 is a diagram of the overall configuration of the tunable laser 10 according to the present embodiment.

The tunable laser 10 includes a half-vertical-cavity surface emitting laser (VCSEL) element 100 as a light emitter, a movable reflector element 200, and a bonding layer 300 to maintain or restrict the relative position of the half-VCSEL element 100 and the movable reflector element 200.

The half-VCSEL element 100 and the movable reflector element 200 have a rectangular shape that is spread in the XY plane, and the bonding layer 300 has a rectangular frame shape extending in Z direction. The boding layer 300 connects the lower-end face of the movable reflector element 200 in the Z direction with the upper-end face of the half-VCSEL element 100 in the Z direction. The lower-end face of the movable reflector element 200 and the upper-end face of the half-VCSEL element 100 constitute XY planes of the movable reflector element 200 and the half-VCSEL element 100, respectively.

The half-VCSEL element 100 has a first reflector 400 (a first reflecting mirror), a semiconductor substrate 500, and an antireflection film 600, laminated in this order from an upper layer to a lower layer in the Z direction The half-VCSEL element 100 has an electrode 101, an electrode 102, and a wiring 103 that electrically connects the electrode 101 and the electrode 102.

The movable reflector element 200 includes a stationary support unit 700 having a rectangular frame shape extending over the XY plane, and a second rectangular reflector 800 (a second reflecting mirror) supported at the center of the XY plane of the stationary support unit 700. The second reflector 800 is supported by the stationary support unit 700 in such a manner that it can approach and separate from the first reflector 400 from a reference facing position with the first reflector 400 defined by the bonding layer 300. (Details will be described later).

There is a space between the first reflector 400 and the second reflector 800, and the space is evacuated or filled with gas.

An active layer 105 (described later with reference to FIG. 2), which is the light emitting source of the half-VCSEL element 100, is disposed between the first reflector 400 and the second reflector 800.

By sweeping the wavelength of the light from the half-VCSEL element 100 and changing the distance (i.e., gap) G between the first reflector 400 and the second reflector 800 in the Z direction, the tunable laser 10 changes the oscillation wavelength of light from the half-VCSEL element 100.

Though, in FIG. 1, the arrow indicating the distance G between the first reflector 400 and the second reflector 800 extends from the second reflector 800 to slightly above the first reflector 400 for convenience sake, the lower end of the arrow is assumed to be drawn out from the first reflector 400.

The structure for changing the distance G from the first reflector 400 to the second reflector 800 in the Z direction will be described in detail later.

FIG. 2 is a diagram of an example of the detailed structure of the half-VCSEL element 100 FIG. 1.

The half-VCSEL element 100 has the semiconductor substrate 500 laminated on the upper surface of the antireflection film 600.

The semiconductor substrate 500 includes a semiconductor substrate such as an n-GaAs substrate.

The first reflector 400 is laminated on the upper surface of the semiconductor substrate 500.

The first reflector 400 constitutes a semiconductor multilayer film reflector having a first semiconductor layer 410, a second semiconductor layer 420, and a third semiconductor layer 430 laminated in this order from the upper layer of the semiconductor multilayer film reflector to the lower layer.

The number and arrangement of the semiconductor layers constituting the first reflector 400 are flexible (not limited to those illustrated here), and various design changes are possible.

The semiconductor layers (for example, the first semiconductor layer 410, the second semiconductor layer 420, and the third semiconductor layer 430) constituting the first reflector 400 includes, for example, a low refractive index layer of n-Al0.9Ga0.1As and a high refractive index layer of n-Al0.2Ga0.8As.

In order to reduce the electric resistance, a composition gradient layer in which the composition gradually changes from one composition to the other may be disposed between the semiconductor layers (i.e., refractive index layers) constituting the first reflector 400. The thickness of the composition gradient layer is, for example, 20 nm.

To set the optical film thickness of each semiconductor layer, or each refractive index layer, to $\lambda/4$, where $\lambda$ is an oscillation wavelength, including ½ of the adjacent composition gradient layers is preferable.

In this case, when the optical thickness of the layer is $\lambda/4$, the actual film thickness D is $\lambda/4n$ where n is the refractive index of the medium of the layer.

On the upper surface of the semiconductor substrate 500, in addition to the first reflector 400, or as a part of the components of the first reflector 400, the electrode 101, the electrode 102, the wiring 103, and a spacer layer 104, the active layer 105, a selective oxide layer 106, a contact layer 107, an insulating layer 108, a mesa 109, a groove 110, an opening 111, and an opening 112 are formed.

The spacer layer 104 includes, for example, a non-doped AlGaInP layer, and is formed on the boundary layer between the first reflector 400 of the semiconductor multilayer and the active layer 105.

A portion including the spacer layer 104 and the active layer 105 is also referred to as a resonator structure or a resonator region, includes ½ of the adjacent composition gradient layer, and has an optical thickness of one wavelength ($\lambda$).

Two spacer layers 104 are disposed with an active layer 105 between the two spacer layers 104 in the Z direction.

The active layer 105 has, for example, a triple quantum well structure having three quantum well layers and four barrier layers.

For example, each quantum well layer is an InGaAs layer and each barrier layer is an AlGaAs layer.

The selective oxide layer 106 includes an oxidized region 106A and a non-oxidized region 106B.

For example, the selective oxide layer 106 composed of p-AlAs with a thickness of 30 nm is disposed the first reflector 400 of the semiconductor multilayer.

The selective oxide layer 106 is disposed, for example, within the second pair of the high refractive index layer and the low refractive index layer counted from the spacer layer 104.

The selective oxide layer 106 may be disposed between layers such as the composition gradient layer and, an intermediate layer. In the present embodiment, the selective oxide layer 106 includes layers actually oxidized.

The contact layer 107 includes, for example, a p-GaAs layer, and is formed on the first reflector 400 of the semiconductor multilayer.

The mesa 109 and the groove 110 are formed by partially etching the first reflector 400 of the semiconductor multilayer (for example, the first semiconductor layer 410, the second semiconductor layer 420, and the third semiconductor layer 430), the spacer layer 104, the active layer 105, and the contact layer 107.

The insulating layer 108 contains, for example, SiN, SiON, or $SiO_2$, and covers the mesa 109. The opening 111 that exposes a part of the contact layer 107 of the mesa 109 is formed in the insulating layer 108.

The opening 111 is formed to overlap the non-oxidized region 106B of the selective oxide layer 106 in a planar view.

An electrode 101 electrically connected to the contact layer 107 through the opening 111 is formed on the insulating layer 108 of the mesa 109.

As the electrode 101, for example, a laminated film in which titanium (Ti)/platinum (Pt)/gold (Au) are laminated in that order from the insulating layer side can be used.

The insulating layer 108 covers the groove 110.

The opening 112 that exposes a part of the semiconductor substrate 500 in the insulating layer 108.

An electrode 102 electrically connected to the contact layer 107 through the opening 112 is formed on the insulating layer 108 of the groove 110.

As the electrode 102, for example, a laminated film in which germanium alloy (AuGe)/nickel (Ni)/gold (Au) are laminated in order from the semiconductor substrate 500 side can be used.

The wiring 103 electrically connects the electrode 101 and the electrode 102.

As the wiring 103, for example, a laminated film in which titanium (Ti)/platinum (Pt)/gold (Au) are laminated in order from the side of the semiconductor substrate 500 can be used.

In the present embodiment, the half-VCSEL element 100 has been described as an example of the "light emitter". Alternatively, a laser diode (LD) or a light-emitting diode (LED) can be used as the "light emitter".

An edge emitting laser (EEL) may be used as the "light emitter".

Furthermore, as the "light emitter", a single light source is applicable, and a plurality of light sources that emits light simultaneously (for example, a VCSEL array light source) is also applicable.

There is a latitude in the specific aspect of "the light emitter", and various design changes are possible.

In a conventional MEMS tunable laser, since electrostatic attraction is used to modulate a cavity length, that is, the distance between the two mirrors facing each other in parallel, the linearity of a drive voltage (a drive signal) and the amount of displacement becomes insufficient to obtain a desired wavelength.

Furthermore, since an initial value of the cavity length cannot be accurately adjusted to the interval of an integral multiple of an oscillation wavelength in manufacturing, undesirably, a high voltage has to be applied to move a movable portion of the mirror to the cavity length that satisfies an oscillation condition at the time of oscillation.

The drive voltage (drive signal) and the cavity length do not have the linearity in a MEMS tunable laser using the electrostatic attraction because the position of the mirror on the MEMS side is proportional to the square of the drive voltage.

The position of the mirror on the MEMS side is determined by an initial gap between the two mirrors without applied voltage, and a balanced condition between the electrostatic attraction generated by the potential difference, and the restoring force of the spring that constitutes the driving structure of the MEMS.

When the drive voltage is increased, the electrostatic attraction, which is a force to cause the two mirrors to attract each other, increases, and the cavity length becomes shorter.

When the voltage range is wide, the displacement amount of the reflector deviates from the linearity.

To avoid such a situation, a method involves distorting the drive voltage in advance such that the wavelength changes linearly with respect to the drive voltage is conceivable.

However, since an initial gap of 1 to 2 μm between the mirrors changes with variations in a device manufacturing, and temperature changes, an initial gap control with ultra-high-precision is difficult to achieve.

Such a method that involves distorting the drive voltage preliminarily under the static conditions fails to have the linearity in the change of the cavity length.

Furthermore, when the gap between the two mirrors changes to ⅓ or more of the initial gap, the electrostatic attraction generated by the potential difference exceeds the restoring force of a spring of the driving structure of the MEMS, which causes a pull-in effect that attracts films to each other. As a result, the MEMS tunable laser does not work.

In other words, the movable range of the mirror in the MEMS tunable laser using the electrostatic attraction is limited to less than ⅓ of the initial gap.

In view of the above-described circumstances, the present embodiment employs a structure in which a piezoelectric element is formed as a film on a spring as a driving source of a reflector on the MEMS side.

In this structure, the cavity length is linearly modulated with respect to the voltage by using the linearity of an applied voltage and the amount of volume reduction of the piezoelectric element.

When an electrode is formed on the spring having a meandering structure connected to the reflector on the MEMS side so as to have the piezoelectric element sandwiched between the spring and the electrode, and the voltage is applied; the volume of the piezoelectric element linearly decreased with the applied voltage.

The spring of the meandering structure deforms in the direction perpendicular to the plane of the film of the piezoelectric element according to a stress generated by this volume reduction in the in-plane direction of the film.

At this time, the linearity is maintained between the stress and the amount of deformation of the piezoelectric element.

Furthermore, since the spring is connected to the reflector, the relation between the amount of deformation of the spring and the amount of displacement of the reflector is linearly maintained. As a result, the reflector can be linearly moved with respect to the voltage.

In addition, since this relationship does not depend on the initial value of the cavity length, the cavity length can be controlled with high accuracy in an electrostatically driven MEMS.

More specifically, in the present embodiment, an elastic support unit 900 that supports the second reflector 800 and the piezoelectric element 1000 disposed in the elastic support unit 900 are formed in the stationary support unit 700 of the movable reflector element 200. The oscillation wavelength of light emitted from the half-VCSEL element is changed by changing the distance between the first reflector 400 and the second reflector 800 by changing the elastic support unit by applying the drive voltage to the piezoelectric element 1000.

The first reflector 400 and the half-VCSEL element 100 are formed as a single unit, that is, a first substrate, and the second reflector 800, the elastic support unit 900, and the piezoelectric element 1000 are formed as a single unit, that is, a second substrate. This allows a simple structure of the tunable laser 10.

For example, the half-VCSEL element 100 constitutes the first substrate and the movable reflector element 200 constitutes the second substrate.

Figure 3:
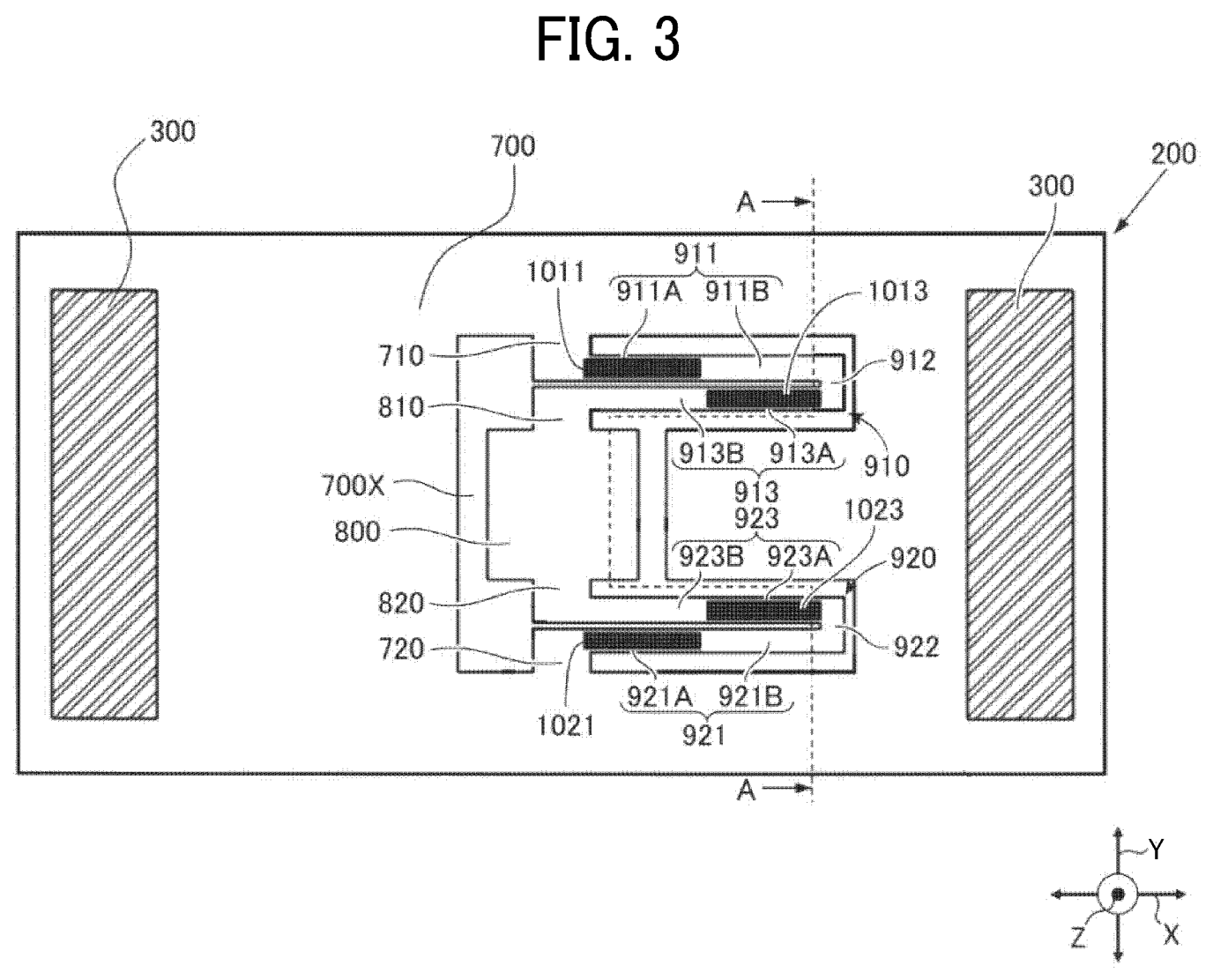

FIG. 3 is a plan view of a first example of the support structure of the second reflector 800 (i.e., support structure of the MEMS side reflector).

Figure 4:
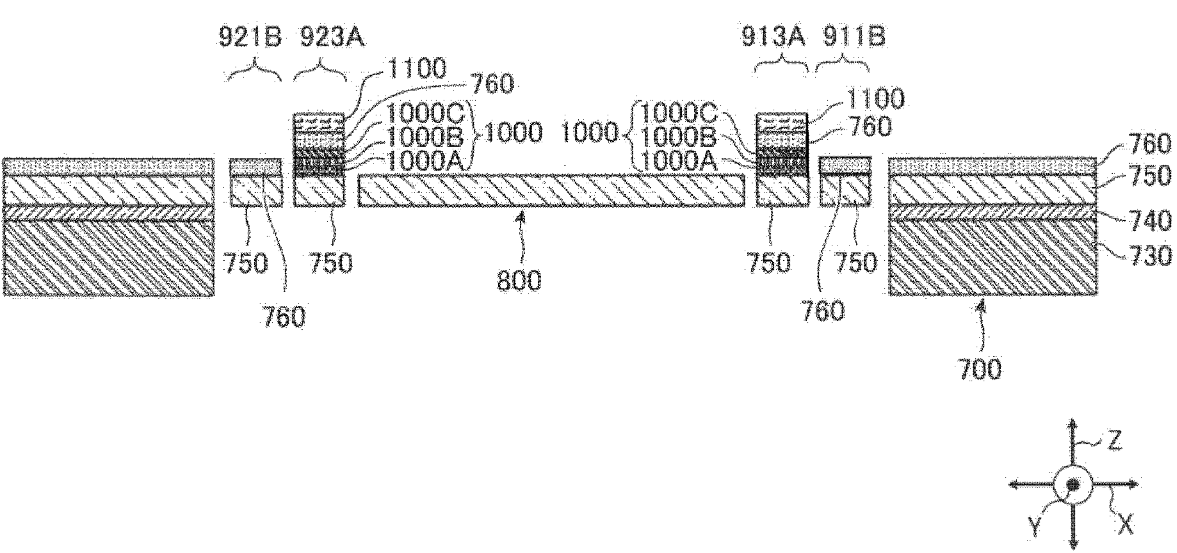
FIG. 4 is a cross-sectional view taken along the line AA of FIG. 3.

FIG. 4 is a cross-sectional view taken along a line AA in FIG. 3.

As illustrated in FIG. 3, the second reflector 800 is supported in a floating state with a through hole 700X interposed in the center of the stationary support unit 700 that spreads in the XY plane.

A connecting end 810 and a connecting end 820 are formed to protrude from the upper and lower sides of the second reflector 800, respectively, and a connecting portion 710 and a connecting portion 720 are formed to protrude from the upper and lower sides of the stationary support unit 700, respectively.

The connecting end 810 and the connecting portion 710 are connected by an elastic support unit 910, and the connecting end 820 and the connecting portion 720 are connected by an elastic support unit 920.

The elastic support units 910 and 920 are disposed apart from each other around the second reflector 800.

The elastic support unit 910 includes a first arm 911 extending to the right from the connecting portion 710, a folded portion 912 folded downward from the first arm 911, and a second arm 913 extending to the left from the folded portion 912 and connected to the connecting end 810. In other words, the elastic support unit 910 forms a meandering structure.

A piezoelectric element 1011 is disposed on the left half of the first arm 911, and is a displacement portion 911A that elastically deforms when the drive voltage is applied to the piezoelectric element 1011.

The piezoelectric element 1011 is not disposed on the right half of the first arm 911, and is a displacement defining portion 911B that does not elastically deform when the drive voltage is applied to the piezoelectric element 1011.

A piezoelectric element 1013 is disposed on the right half of the second arm 913, and is a displacement portion 913A that elastically deforms when a drive voltage is applied to the piezoelectric element 1013.

The piezoelectric element 1013 is not disposed on the left half of the second arm 913, and is a non-displacement defining portion 913B that does not elastically deform when the drive voltage is applied to the piezoelectric element 1013.

As described above, the elastic support unit 910 includes the first arm 911 and the second arm 913 extending adjacent to each other, and the folded portion 912 connecting the ends on the same side of the first arm 911 and the second arm 913 in the extending direction. The piezoelectric element 1011 is disposed on the first arm 911 and the piezoelectric element 1013 is disposed on the second arm 913.

The piezoelectric element 1011 and the piezoelectric element 1013 are arranged at different positions, which are displaced from each other in the extending direction of the first arm 911 and the second arm 913. In other words, the piezoelectric element 1011 and the piezoelectric element 1013 are not aligned along the direction orthogonal to the extending direction of the first arm 911 and the second arm 913.

The elastic support unit 920 includes a first arm 921 extending to the right from the connecting portion 720, a folded portion 922 folded upward from the first arm 921, and a second arm 923 extending to the left from the folded portion 922 and connected to the connecting end 820. In other words, the elastic support unit 920 forms the meandering structure.

A piezoelectric element 1021 is disposed on the left half of the first arm 921, and is a displacement portion 921A that elastically deforms when the drive voltage is applied to the piezoelectric element 1021.

The piezoelectric element 1021 is not disposed on the right half of the first arm 921, and is a displacement defining portion 921B that does not elastically deform when the drive voltage is applied to the piezoelectric element 1021.

A piezoelectric element 1023 is disposed on the right half of the second arm 923, and is a displacement portion 923A that elastically deforms when the drive voltage is applied to the piezoelectric element 1023.

The piezoelectric element 1023 is not disposed on the left half of the second arm 923, and is a displacement defining portion 923B that does not elastically deform when the drive voltage is applied to the piezoelectric element 1023.

As described above, the elastic support unit 920 includes the first arm 921 and the second arm 923 extending adjacent to each other, and the folded portion 922 connects the ends on the same side of the first arm 921 and the second arm 923 in the extending direction. The piezoelectric element 1021 is disposed on the first arm 921, and the piezoelectric element 1023 is disposed on the second arm 923.

The piezoelectric element 1021 and the piezoelectric element 1023 are arranged at different positions, which are displaced from each other in the extending direction of the first arm 921 and the second arm 923. In other words, the piezoelectric element 1021 and the piezoelectric element 1023 are not aligned along the direction orthogonal to the extending direction of the first arm 921 and the second arm 923.

As illustrated in FIG. 4, the stationary support unit 700 includes a support layer 730, an oxide insulating layer 740, a silicon active layer 750, and an insulating layer 760, which are laminated in this order from the lower layer side to the upper layer side in the Z direction.

A displacement defining portion 911B and a displacement defining portion 921B include the silicon active layer 750 and the insulating layer 760, which are laminated in this order from the lower layer side to the upper layer side in the Z direction (the displacement defining portion 911B and the displacement defining portion 921B are a laminated structure which partially share the stationary support unit 700).

A displacement portion 913A (including the piezoelectric element 1013) and a displacement portion 923A (including the piezoelectric element 1023) include an actuator in which the piezoelectric element 1000 is formed on the upper surface of the silicon active layer 750. The piezoelectric element 1000 include a lower electrode 1000A, a piezoelectric material 1000B, and an upper electrode 1000C laminated in this order from the lower layer side to the upper layer side in the Z direction.

By applying a drive voltage to a lower electrode 1000A and an upper electrode 1000C, the displacement portion 913A and the displacement portion 923A are elastically deformed. The insulating layer 760 and a protective film 1100 are disposed on the upper surface of the piezoelectric element 1000 (the upper electrode 1000C).

In the present embodiment, by applying the drive voltage to the piezoelectric elements 1011, 1013, 1021, and 1023 to elastically deform the elastic support units 910 and 920 and to change the distance between the first reflector 400 and the second reflector 800, the oscillation wavelength of the light by the half-VCSEL element 100 is changed.

With displacement generated by combinations of the actuators (the piezoelectric elements 1011, 1013, 1021, and 1023) on the meandering structure, the displacement defining portions 911B, 913B, 921B, and 923B, and the folded portions 912 and 922 via the connecting ends 810 and 820, the second reflector 800 as a movable reflector translationally moves in the Z direction while maintaining the parallelism between the stationary support unit 700 and the second reflector 800.

This translational movement in the Z direction is caused by the potential difference generated by applying the drive voltage to the lower electrode 1000A and the upper electrode 1000C of the actuator.

Figure 5:
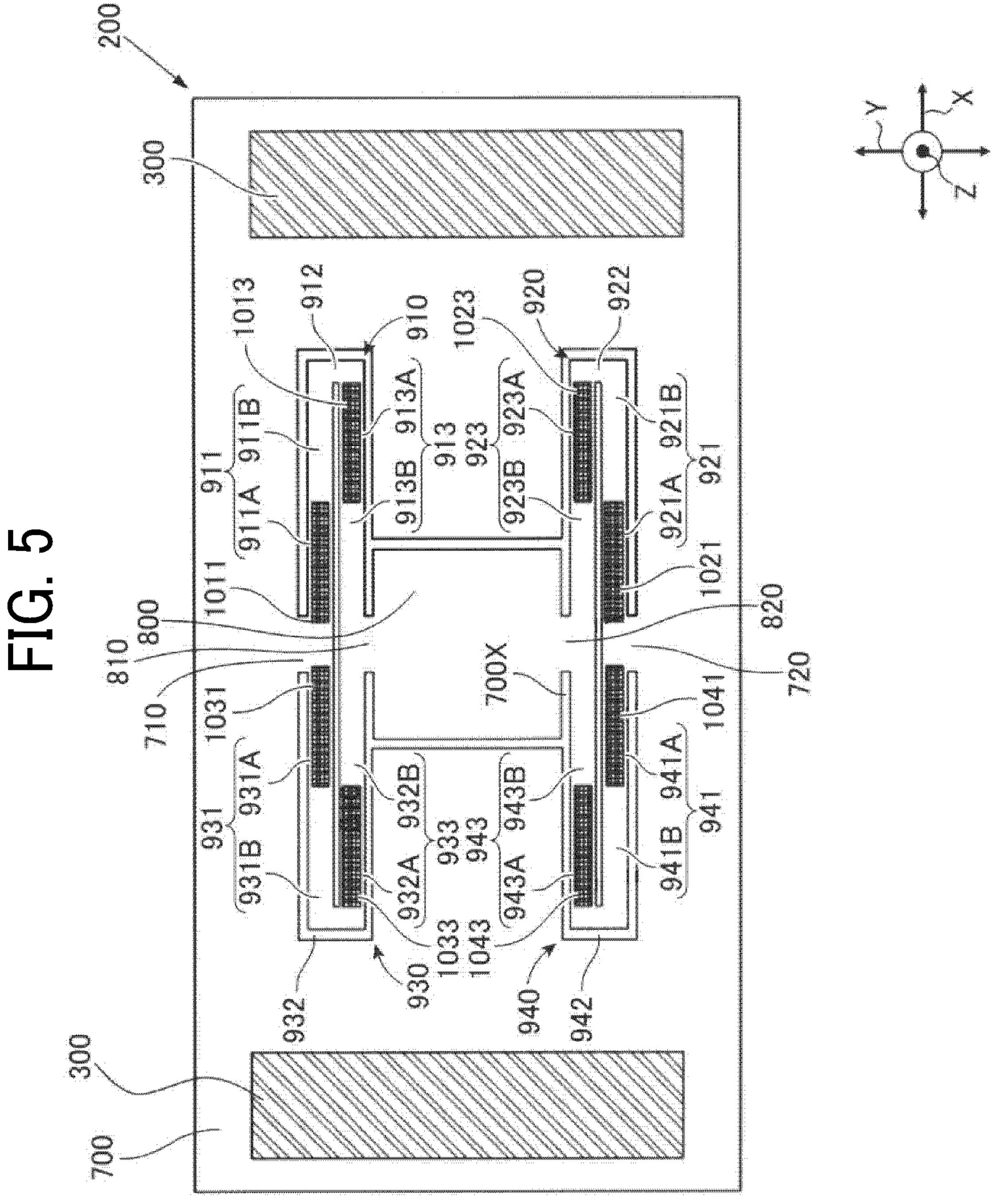
FIG. 5 is a plan view of a second example of a support structure of a second reflector.

FIG. 5 is a plan view illustrating a second example of the support structure (the support structure of the MEMS side reflector) of the second reflector 800.

Figure 6:
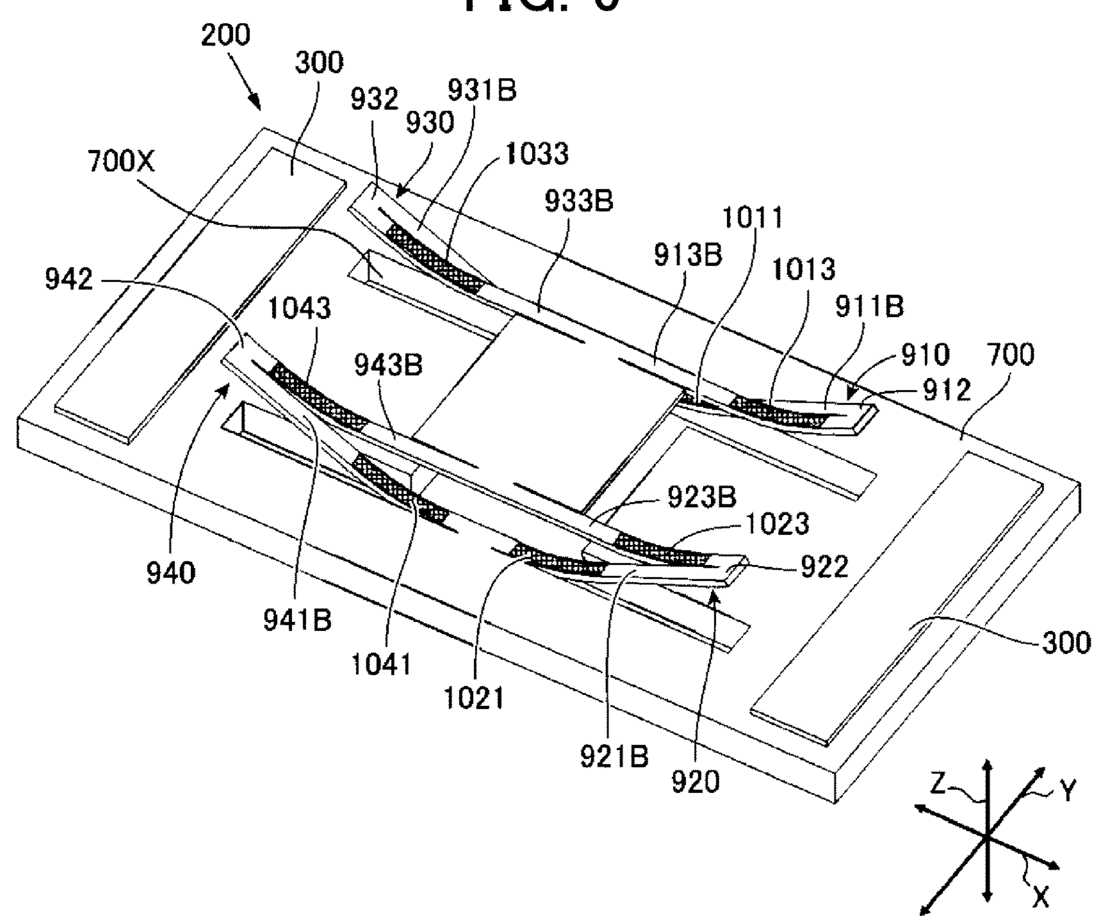
FIG. 6 is a perspective view illustrating a driving state of a second reflector in the support structure of FIG. 5.
Figure 7:
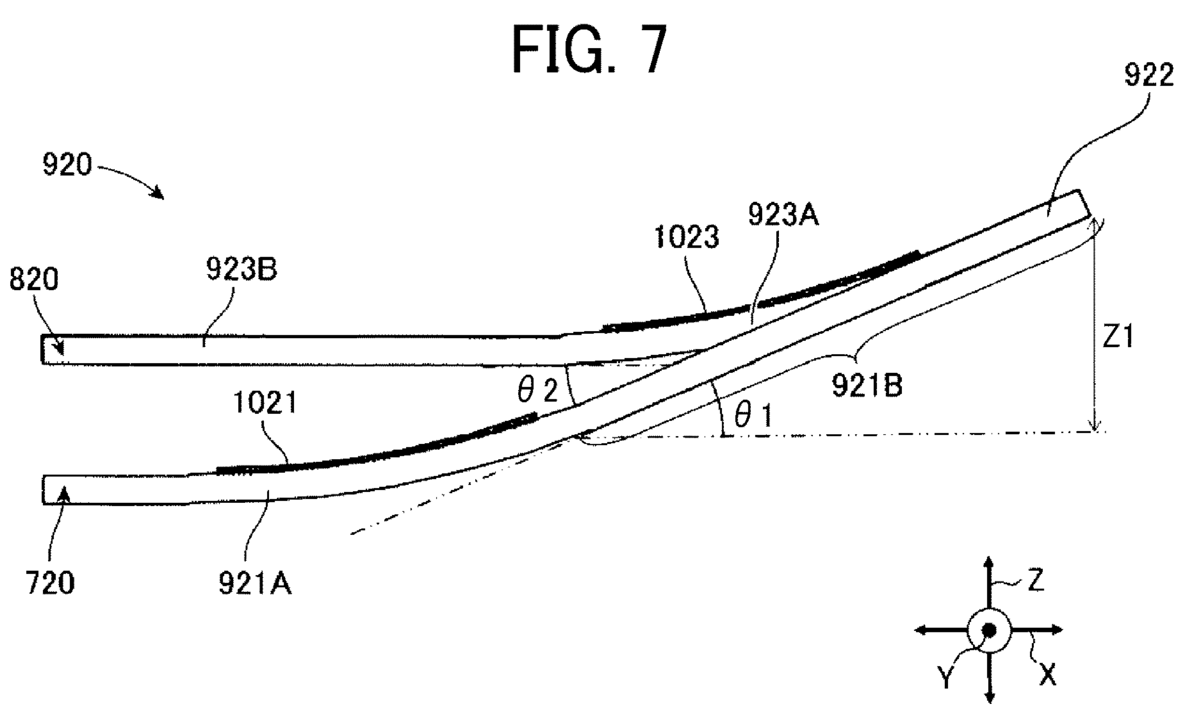
FIG. 7 is a side view illustrating a driving state of the second reflector in the support structure of FIG. 5.

FIG. 6 is a perspective view illustrating a driving state of the second reflector 800 of the support structure in FIG. 5. FIG. 7 is a side view of a driving state of the second reflector 800 of the support structure in FIG. 5.

The second example includes, in addition to the elastic support units 910 and 920 disposed on the right half of the stationary support unit 700 extending in the XY plane, the elastic support units 930 and 940 on the left half of the stationary support unit 700 extending in the XY plane.

The elastic support units 910, 920, 930, and 940 are apart from each other around the second reflector 800.

As described above, by providing the four elastic support units 910, 920, 930, and 940 symmetrically at the four corners of the stationary support unit 700 extending in the XY plane, a parallelism between the stationary support unit 700 and the second reflector 800 as a movable reflector can be maintained more steadily.

The elastic support unit 930 includes a first arm 931 extending to the left from the connecting portion 710, a folded portion 932 folded downward from the first arm 931, and a second arm 933 extending to the right from the folded portion 932 and to the connecting end 810. In other words, the elastic support unit 930 forms the meandering structure.

A piezoelectric element 1031 is disposed on the right half of the first arm 931, and is a displacement portion 931A that elastically deforms when the drive voltage is applied to the piezoelectric element 1031.

The piezoelectric element 1031 is not disposed on the left half of the first arm 931, and is a displacement defining portion 931B that does not elastically deform when the drive voltage is applied to the piezoelectric element 1031.

A piezoelectric element 1033 is disposed on the left half of the second arm 933, and is a displacement portion 933A that elastically deforms when the drive voltage is applied to the piezoelectric element 1033.

The piezoelectric element 1033 is not disposed on the right half of the second arm 933, and is a displacement defining portion 933B that does not elastically deform when a drive voltage is applied to the piezoelectric element 1033.

As described above, the elastic support unit 930 includes the first arm 931 and the second arm 933 extending adjacent to each other, and the folded portion 932 connecting the ends on the same side of the first arm 931 and the second arm 933 in the extending direction. The piezoelectric element 1031 is disposed on the first arm 931, and the piezoelectric element 1033 is disposed on the second arm 933.

The piezoelectric element 1031 and the piezoelectric element 1033 are arranged at different positions, which are displaced from each other in the extending direction of the first arm 931 and the second arm 933. In other words, the piezoelectric element 1031 and the piezoelectric element 1033 are not aligned along the direction orthogonal to the extending direction of the first arm 931 and the second arm 933.

The elastic support unit 940 includes a first arm 941 extending to the left from the connecting portion 720, a folded portion 942 folded upward from the first arm 941, and a second arm 943 extending to the right from the folded portion 942 and connected to the connecting end 820. In other words, the elastic support unit 940 forms a meandering structure.

A piezoelectric element 1041 is disposed on the right half of the first arm 941, and is a displacement portion 941A that elastically deforms when the drive voltage is applied to the piezoelectric element 1041.

The piezoelectric element 1041 is not disposed on the left half of the first arm 941, and is a displacement defining portion 941B that does not elastically deform when the drive voltage is applied to the piezoelectric element 1041.

A piezoelectric element 1043 is disposed the left half of the second arm 943, and is a displacement portion 943A that elastically deforms when the drive voltage is applied to the piezoelectric element 1043.

The piezoelectric element 1043 is disposed on the right half of the second arm 943, and is a displacement defining portion 943B that does not elastically deform when the drive voltage is applied to the piezoelectric element 1043.

As described above, the elastic support unit 940 includes the first arm 941 and the second arm 943 extending adjacent to each other, and the folded portion 942 connecting the ends on the same side of the first arm 941 and the second arm 943 in the extending direction. The piezoelectric element 1041 is disposed on the first arm 941 and the piezoelectric element 1043 is disposed on the second arm 943.

The piezoelectric element 1041 and the piezoelectric element 1043 are disposed not to be in parallel with a direction (i.e., the vertical direction of the drawing) orthogonal to the extending directions of the first arm 941 and the second arm 943.

The piezoelectric element 1041 and the piezoelectric element 1043 are arranged at different positions, which are displaced from each other in the extending direction of the first arm 941 and the second arm 943. In other words, the piezoelectric element 1041 and the piezoelectric element 1043 are not aligned along the direction orthogonal to the extending direction of the first arm 941 and the second arm 943.

In this present embodiment, by applying the drive voltage to the piezoelectric elements 1011, 1013, 1021, 1023, 1031, 1033, 1041, and 1043 to the elastic support units 910, 920, 930, and 940 to change the distance between the first reflector 400 and the second reflector 800, the oscillation wavelength of the light by the half-VCSEL element 100 is changed.

When a drive voltage is applied to a piezoelectric element, the volume of the piezoelectric element changes.

Since the piezoelectric element and the arm are physically connected, an in-plane stress is generated in the vicinity of the piezoelectric element of the arm.

The arm stressed elastically deforms to relieve the stress.

At this time, adding an anisotropy to a dimension ratio of the arm in the XY direction to shorten the thickness of the arm in the Z direction causes the arm to warp dominantly in the Z direction, and the piezoelectric element also warps in the Z direction with a predetermined radius of curvature maintained.

The warp of the arm generated by the piezoelectric element is transmitted to the displacement defining portion without the piezoelectric element.

The warp of the displacement defining portion in the Z direction due to gravity, which is much smaller than the warp of the piezoelectric element, can be ignored. In other words, the warp of the displacement defining portion is equivalent to a negligibly small elastic deformation.

FIG. 7 is an enlarged view of the elastic support unit 920 as an example, and the elastic support units 910, 930, and 940 have the similar configuration.

As illustrated in FIG. 7, the displacement Z1 of the folded portion 922 of the elastic support unit 920 in the Z direction at least increases the warp (reducing the radius of curvature) generated by the piezoelectric elements 1021 and 1023, and lengthens the displacement defining portion 921B of the first arm 921.

The first arm 921 tilts toward the folded portion 922 at an angle θ1 from a free state, and after the folded portion 922 is folded back, the second arm 923 tilts at an angle θ2 from the free state (the difference between the angle θ1 and the angle θ2 is an tilt angle between the first arm 921 and the second arm 923).

When the second arm 923 has a piezoelectric element with the same dimensions of the piezoelectric element of the first arm 921 drives, the tilt of the first arm 921 is canceled out. Therefore, at the connecting end 820 disposing at the end of the second arm 923, the second reflector 800 as a movable reflector can be moved in the Z direction with maintaining the parallelism between the XY plane of the stationary support unit 700 and the second reflector 800 as a movable reflector from before driving.

The dimensions of the piezoelectric elements formed on the first arm 921 and the second arm 923 on the XY plane may or may not be the same.

When the dimensions of the piezoelectric elements formed on the first arm 921 and the second arm 923 on the XY plane is not the same, the voltage applied to each piezoelectric element is adjusted such that the warpage generated in each piezoelectric element is the same.

The drive voltage applied to the piezoelectric element is a DC voltage and may alternatively be a sine waveform, a cosine waveform, or a triangular waveform whose voltage changes with time.

Under a condition that the modulation frequency of the voltage and the resonance frequency of the movable reflector element are separated from each other, the linearity of the displacement amount with respect to voltage is maintained as described above.

Piezoelectric elements are driven by applying a voltage, and there is a linearity between a voltage and a generated stress.

Since the generated stress and the amount of deformation of the arm also have the linearity, the applied voltage and the amount of displacement have the linearity.

Figure 8:
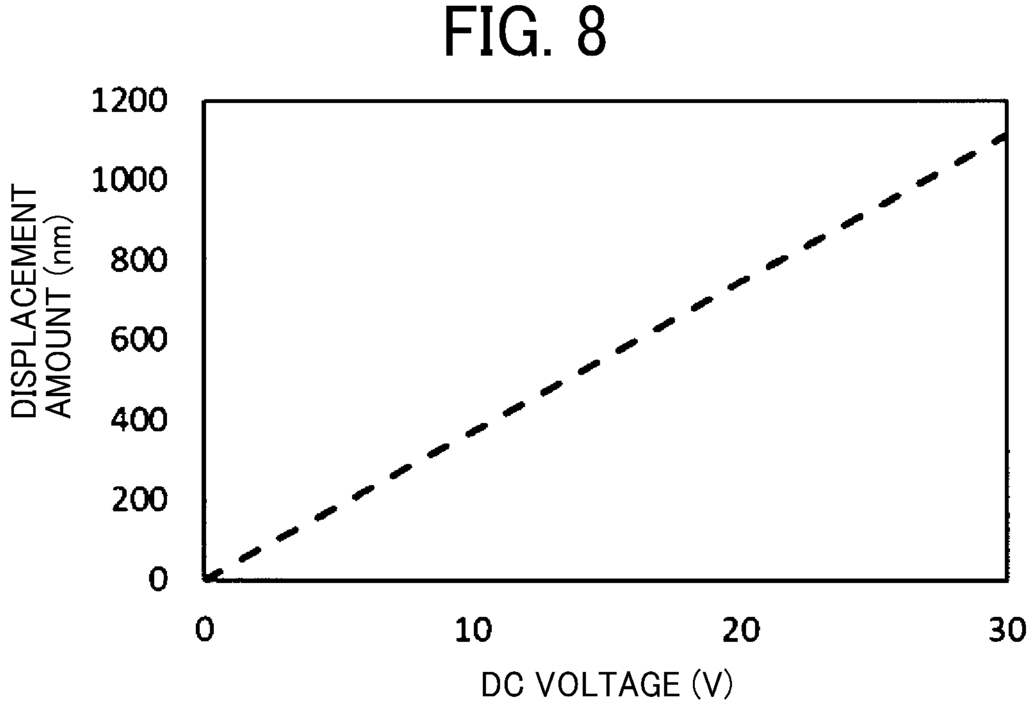
FIG. 8 is a graph of a relation between a drive voltage and a cavity length in the tunable laser in FIG. 1.
Figure 9:
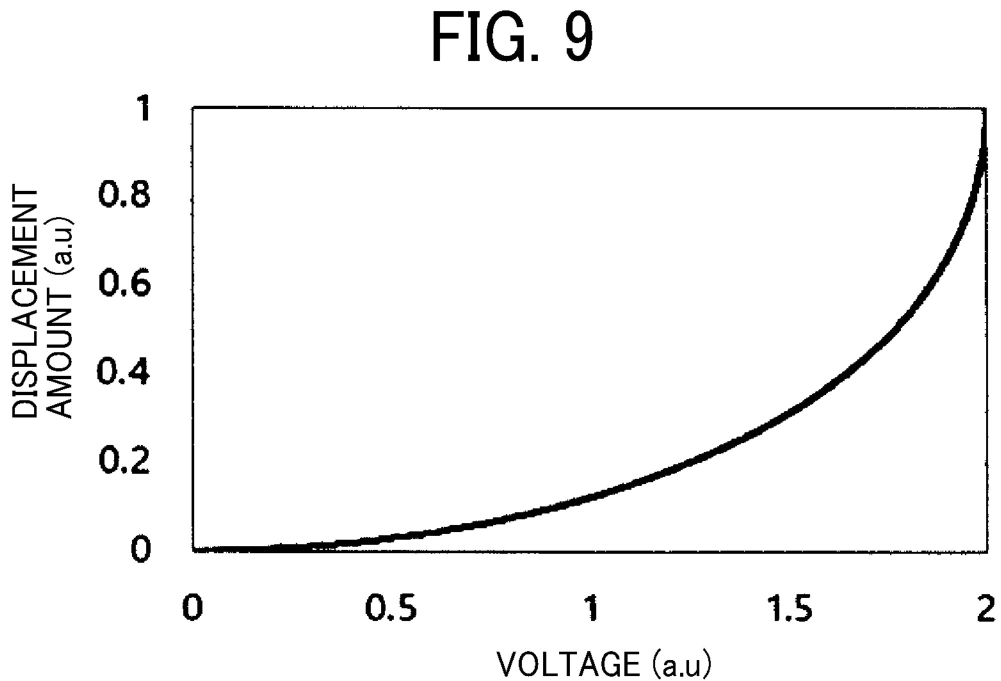
FIG. 9 is a graph of a relation between a drive voltage and a cavity length in a MEMS tunable laser using electrostatic attraction according to a comparative example.

FIG. 8 is a graph illustrating the relation between the drive voltage of the tunable laser 10 and the cavity length in the present embodiment. FIG. 9 is a graph illustrating the relation between the driving voltage and the cavity length of the conventional MEMS tunable laser with the electrostatic attraction.

As illustrated in FIG. 8, according to the tunable laser 10 of the present embodiment, a high linearity between the drive voltage and the cavity length is realized.

On the other hand, as illustrated in FIG. 9, since the position of the mirror on the MEMS side in the conventional MEMS tunable laser using the electrostatic attraction is proportional to the square of the drive voltage, and the pull-in effect in which the films are attracted to each other when the gap between the two mirrors displaced to ⅓ or more of the initial gap large, the linearity between the drive voltage and the cavity length is insufficient to obtain.

Figure 10:
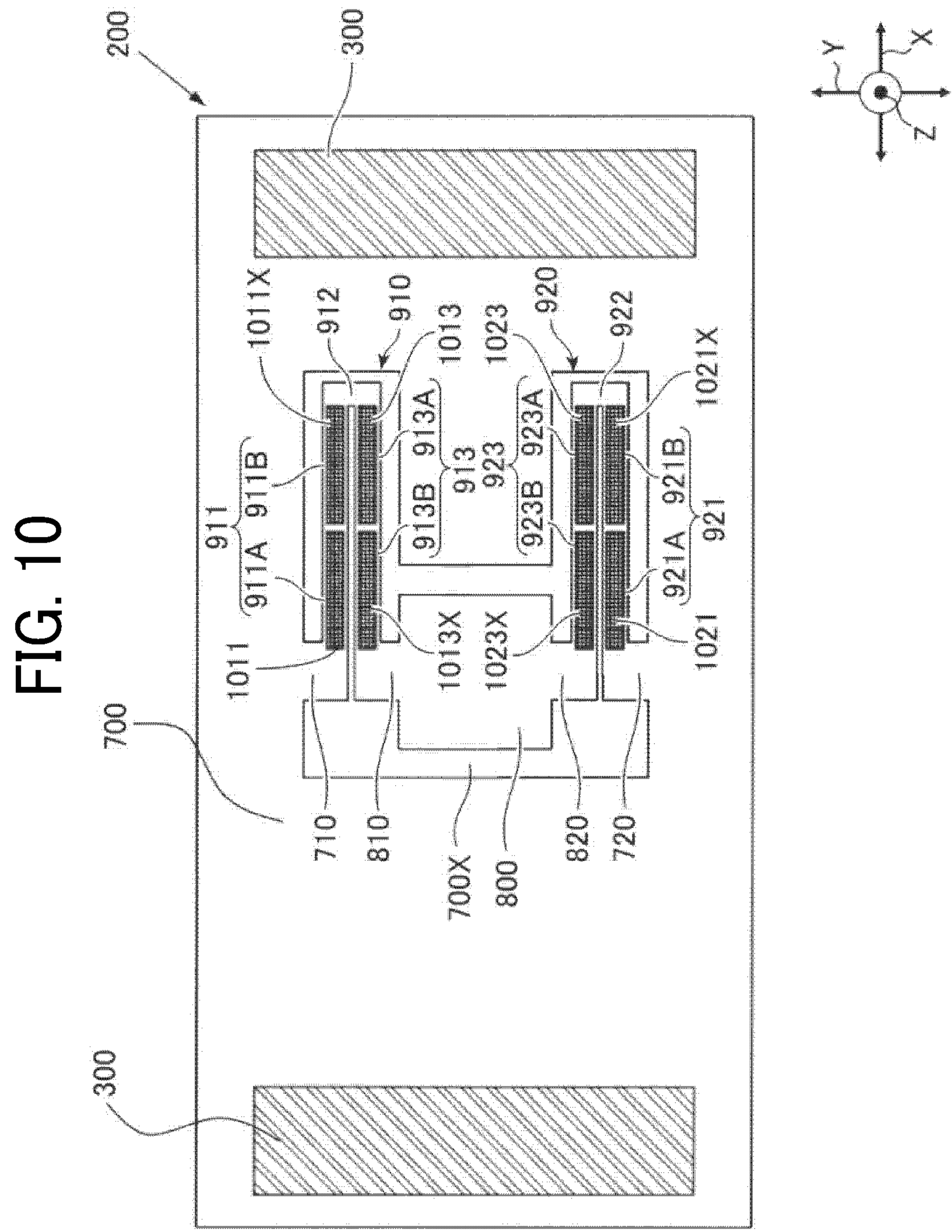
FIG. 10 is a plan view of a third example of the support structure of the second reflector.

FIG. 10 is a plan view illustrating a third example of the support structure of the second reflector 800 (support structure of the MEMS side reflector).

In the third example, the piezoelectric element 1011X is disposed at the region of the displacement defining portion 911B of the first arm 911 in which the piezoelectric element is not disposed in the first example, and the piezoelectric element 1013X is disposed at the region of the displacement defining portion 913B of the second arm 913, and the piezoelectric element 1021X is disposed at the region of the displacement defining portion 921B of the first arm 921, and the piezoelectric element 1023X is disposed at the region of the displacement defining portion 923B of the second arm 923.

Piezoelectric elements 1011, 1013, 1021, 1023, 1011X, 1013X, 1021X, 1023X are arranged along the direction (i.e., the vertical direction of the drawing sheet) orthogonal to the extending direction of the first arm 911 and the second arm 913 and also orthogonal to the extending direction of the first arm 921 and the second arm 923.

In the third example, the piezoelectric element includes a first set of piezoelectric elements 1011, 1013, 1021, and 1023 and a second set of piezoelectric elements 1011X, 1013X, 1021X, and 1023X.

When a drive voltage is applied to the first set of piezoelectric elements, the drive voltage is not applied to the second set of piezoelectric elements. Conversely, when the drive voltage is applied to the second set of piezoelectric elements, the drive voltage is not applied to the first set of piezoelectric elements.

In the third example, when voltage is applied to the piezoelectric element 1011, the region of the displacement portion 911A of the first arm 911 serves as the displacement portion, and the region of the displacement portion 911B serves as the displacement defining portion. When voltage is applied to the piezoelectric element 1011X, the region of the displacement defining portion 911B of the first arm 911 serves as the displacement portion, and the region of the displacement portion 913A serves as the displacement defining portion.

When voltage is applied to the piezoelectric element 1013, the region of the displacement portion 913A of the second arm 913 serves as the displacement portion, and the region of the displacement portion 913B serves as the displacement defining portion. When voltage is applied to the piezoelectric element 1013X, the region of the displacement portion 913B of the second arm 913 serves as the displacement portion, and the region of the displacement portion 913A of the second arm 913 serves as the displacement defining portion.

When voltage is applied to the piezoelectric element 1021, the region of the displacement portion 921A of the first arm 921 serves as the displacement portion, and the region of the displacement defining portion 921B of the first arm 921 serves as the displacement defining portion. When voltage is applied to the piezoelectric element 1021X, the region of the displacement portion 921B of the first arm 921 serves as the displacement portion, and the region of the displacement portion 921A of the first arm 921 serves as the displacement defining portion.

When voltage is applied to the piezoelectric element 1023, the region of the displacement portion 923A of the second arm 923 serves as the displacement portion, and the region of the displacement defining portion 923B of the second arm 923 serves as the displacement defining portion. When voltage is applied to the piezoelectric element 1023X, the region of the displacement defining portion 923B of the second arm 923 serves as the displacement portion, and the region of the displacement portion 923A of the second arm 923 serves as the displacement defining portion.

In the first example, the displacement defining portion is the portion without the piezoelectric element among the plurality of arms. On the other hand, in the third example, the displacement defining portion is the portion with the piezoelectric element and without the applied voltage among the plurality of arms.

In the third example, when a failure or malfunction accidentally occurs in the piezoelectric elements included in one set of the first set and the second set of the piezoelectric elements, the tunable laser 10 can be operated by applying the voltage to the other set without being affected by the failure or malfunction of the piezoelectric element.

Figure 11A:
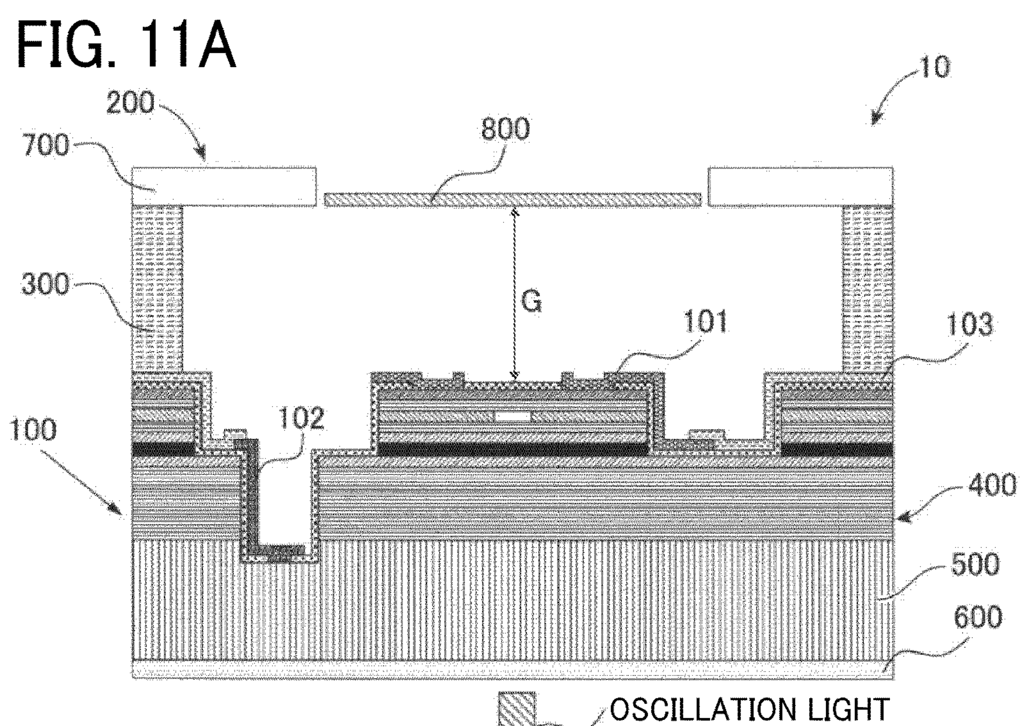
FIG. 11A and FIG. 11B are illustrations for describing wavelength sweeping by the tunable laser in FIG. 1, according to an embodiment of the present disclosure.
Figure 11A:
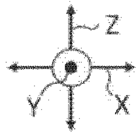
Figure 11B:
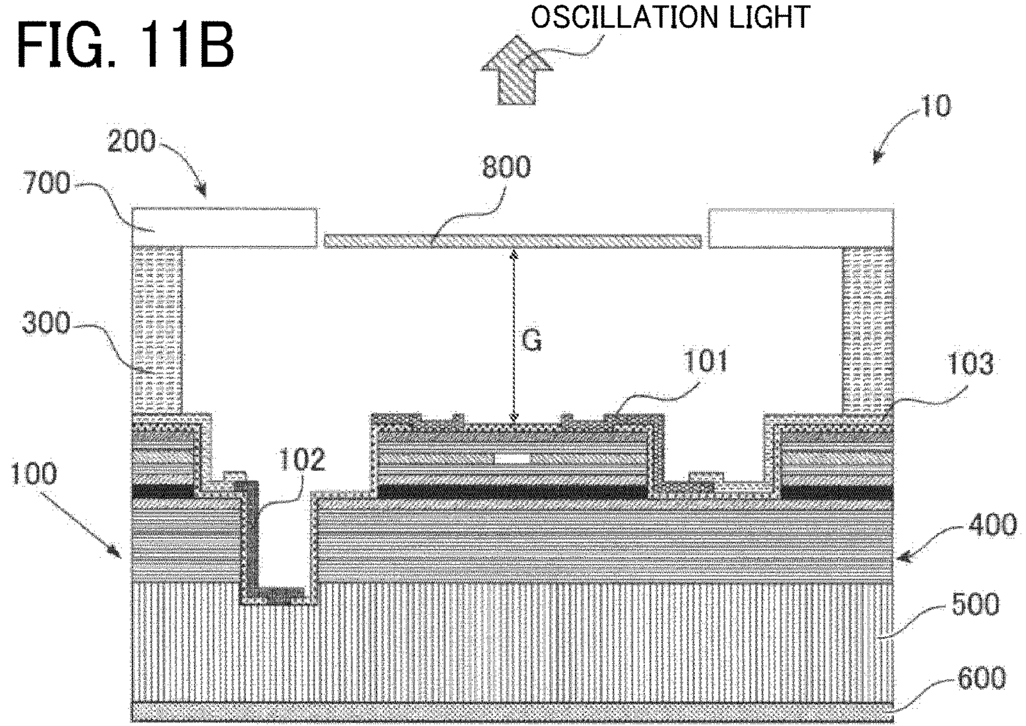
Figure 11B:
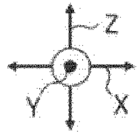

FIGS. 11A and 11B are diagrams of an example of wavelength sweeping by the tunable laser 10 of the present embodiment.

The laser oscillation wavelength of the tunable laser 10 is defined by an emission spectrum (i.e., a wavelength distribution) characteristic in materials constituting the active layer 105 and the resonator structure.

The resonator structure is characterized by the distance G in the Z direction between the first reflector 400 and the second reflector 800, and the refractive index and dimensions of the material existing between the first reflector 400 and the second reflector 800.

The active layer 105 emits light with the current injected into the half-VCSEL element 100 through the electrodes, and the wavelength of the resonant light (i.e., the oscillation light) changes with variation of the distance G between the first reflector 400 and the second reflector 800 in the Z direction.

In FIG. 11A is a diagram of the resonant light (i.e., the oscillation light) emitted upward in the Z direction. In FIG. 11B is a diagram of the resonant light (i.e., the oscillating light) emitted upward in the Z direction.

Since the distance G between the first reflector 400 and the second reflector 800 in the Z direction can be changed by changing the position of the second reflector 800 as a movable reflector element in the Z direction, the wavelength of the resonant light (i.e., oscillating light) can be modulated.

In particular, in the present embodiment, the distance G between the first reflector 400 and the second reflector 800 in Z the direction can be controlled with high accuracy by devising the support structure of the second reflector 800 by using the elastic support unit 900 and the piezoelectric element 1000.

As a result, the linearity of the oscillation wavelength with respect to the drive voltage is improved and the light having a desired oscillation wavelength is obtained.

Figure 12:
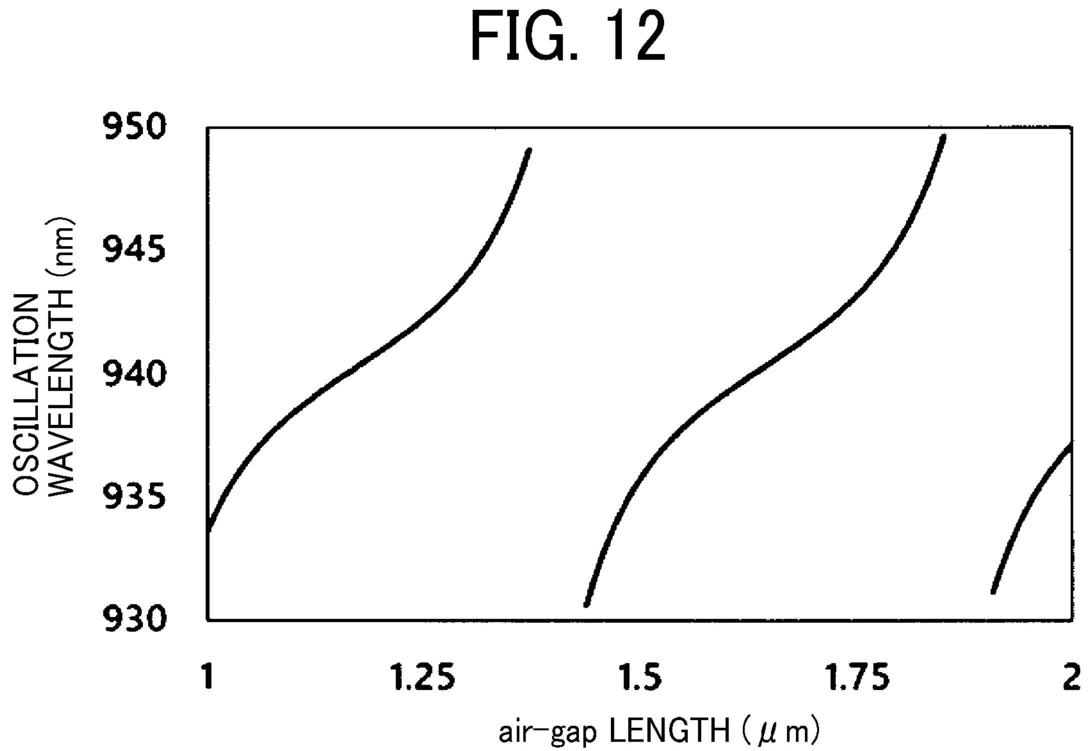
FIG. 12 is a graph of the simulation results of a relation between the length of a gap between the half-VCSEL element and the second reflector and the oscillation wavelength.

FIG. 12 is a graph of a simulation result illustrating the relationship between the length of the gap between the first reflector 400 and the second reflector 800 of the half-VCSEL element 100 and the oscillation wavelength.

The oscillating light emitted by the half-VCSEL element 100 is emitted to the first reflector 400 or the second reflector 800, whichever has a lower reflectance.

Therefore, by adjusting the magnitude of the reflectance between the first reflector 400 and the second reflector 800, the emission direction of the oscillating light by the half-VCSEL element 100 can be adjusted.

When the reflectance of the first reflector 400 is set to be lower than the reflectance of the second reflector 800, the oscillating light is emitted downward in the Z direction (FIG. 11A). When the reflectance of the first reflector 400 is set to be higher than the reflectance of the second reflector 800, the oscillating light is emitted upward in the Z direction (FIG. 11B).

A bonding layer including multilayer metal films containing a plurality of metals is formed on each of the half-VCSEL element 100 (first reflector 400) and the second reflector 800.

For example, by bonding the bonding layers on each element together with an atomic diffusion bonding method, a space can be obtained between the first reflector 400 and the second reflector 800.

The active layer 105 of the half-VCSEL element 100 is disposed in the center of the resonator structure, which is a position corresponding to the antinode in the standing wave of the electric field to obtain a highly stimulated emission probability.

Figure 13:
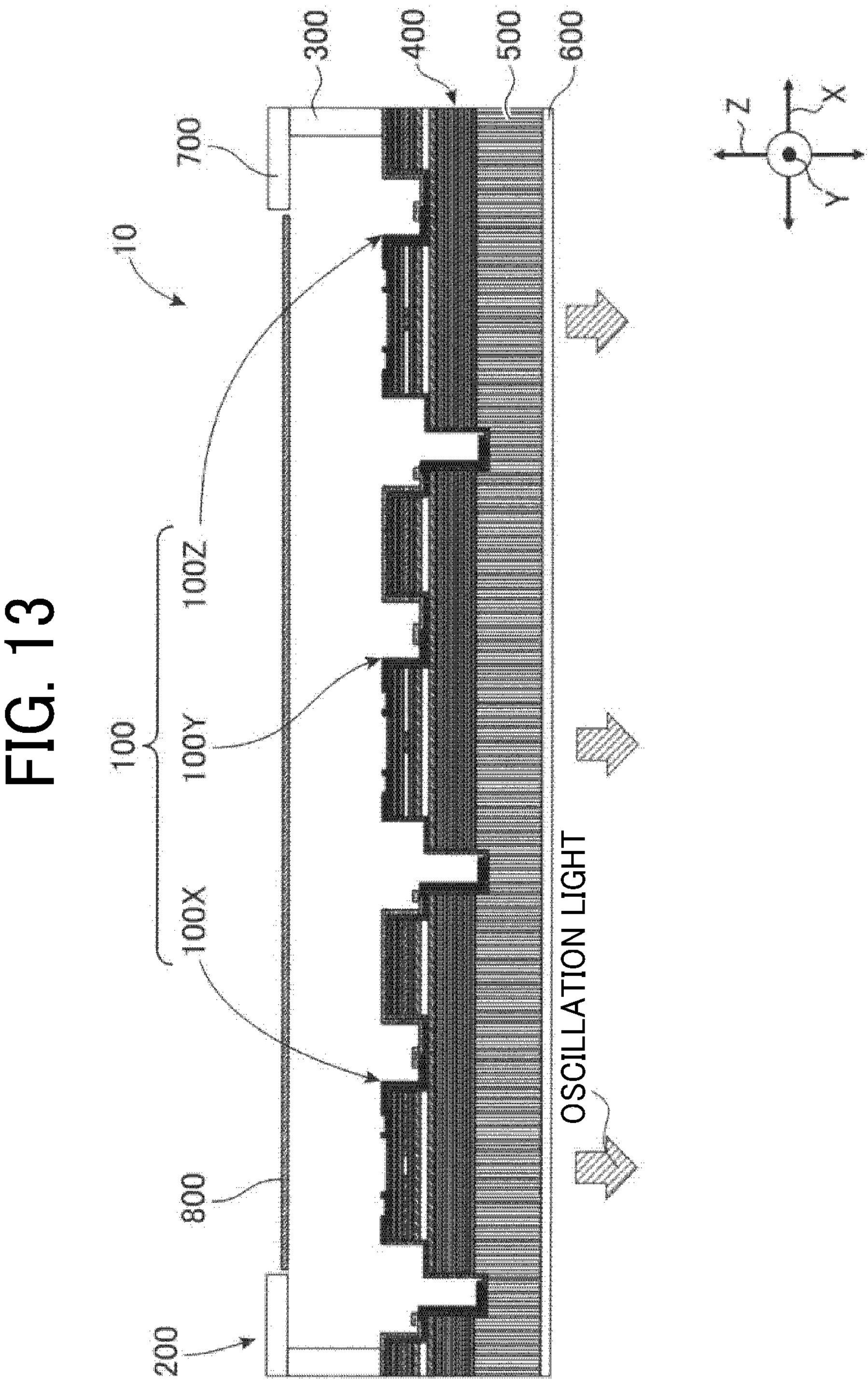
FIG. 13 is a diagram of a tunable laser according to a modification of an embodiment of the present disclosure, corresponding to FIG. 1.

FIG. 13 is a diagram of a modified example of the tunable laser 10 of the present embodiment, corresponding to FIG. 1.

As illustrated in FIG. 13, one second reflector 800 is provided with a plurality of half-VCSEL elements 100.

Specifically, one second reflector 800 is provided with three half-VCSEL elements 100X, 100Y, and 100Z adjacent to each other in the X direction on the XY plane.

The first reflector 400, the semiconductor substrate 500, and the antireflection film 600 may be shared by these three half-VCSEL elements 100X, 100Y, and 100Z.

There is a degree of latitude in the number and arrangement of half-VCSEL elements, and various design changes are possible. For example, the second reflector is provided with two or four or more half-VCSEL elements. In other words, the number of half-VCSEL elements is not limited to three, and may be any plural number (i.e., the second substrate includes a plurality of light emitters.) Alternatively, the second reflector is provided with a plurality of half-VCSEL elements arranged in the Z direction, instead of or in addition to the plurality of half-VCSEL elements arranged in the X direction or the Y direction within the XY plane.

Figure 14:
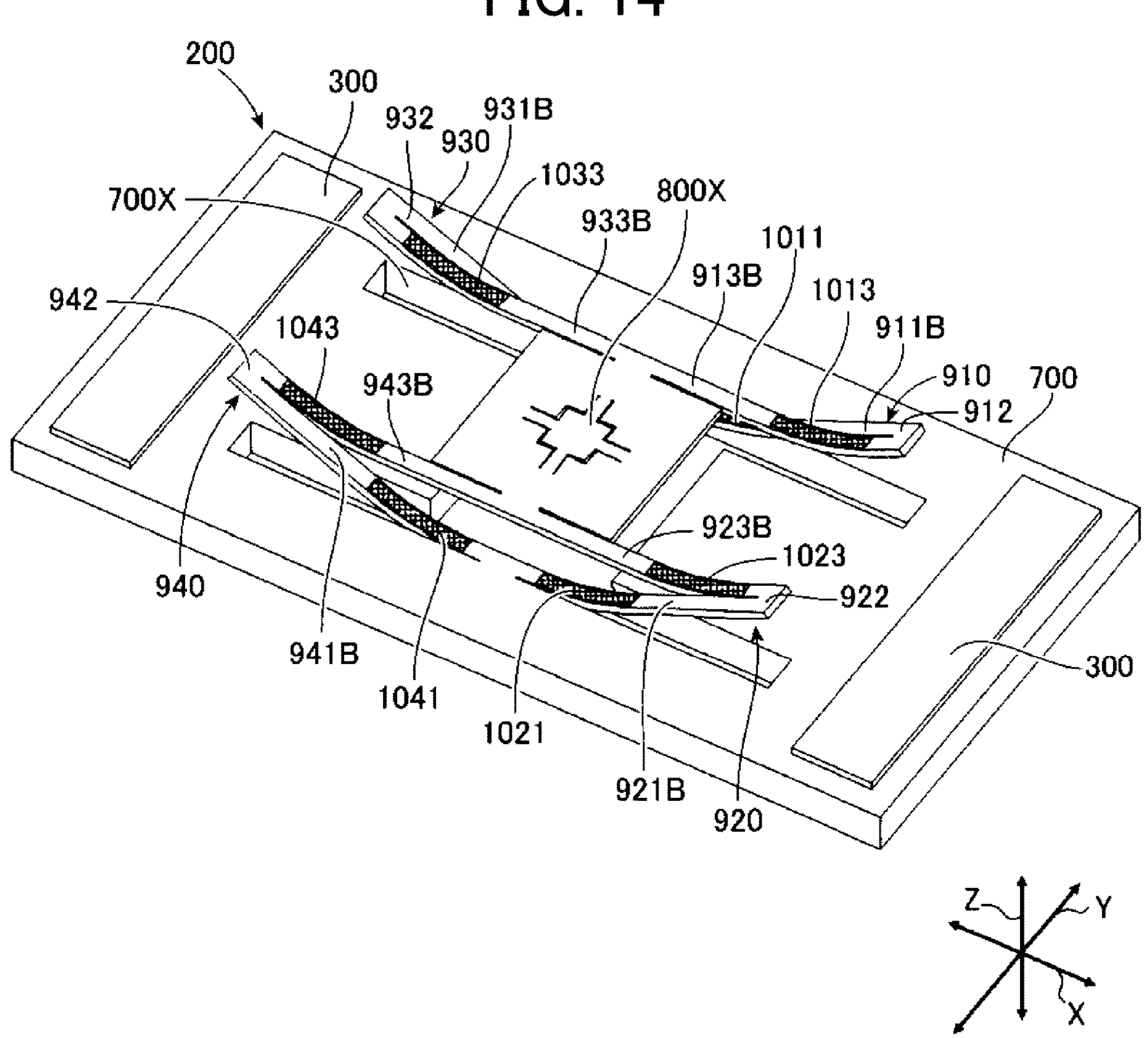
FIG. 14 is a diagram of a modified example of the tunable laser according to a modification of an embodiment of the present disclosure, corresponding to FIG. 6.

FIG. 14 is a diagram of a modified example of the tunable laser 10 of the present embodiment, corresponding to FIG. 6.

In FIG. 14, a movable reflector structure 800X for high-speed driving inside the second reflector 800 as a movable reflector is additionally illustrated.

The length of the gap between the half-VCSEL element 100 (first reflector 400) and the second reflector 800, which are bonded together with the bonding layer 300 between the half-VCSEL element 100 and the second reflector 800, depends on the usage environment (e.g., temperature) of the tunable laser 10.

The change length of this gap is several micrometers. A center of the oscillation wavelength is fixed by statically driving the meandering structure with a voltage prepared (preset) according to the usage environment (e.g., temperature) of the tunable laser 10.

With the center wavelength fixed, the movable reflector structure 800X for high-speed driving is displaced to several tens of nm by a modulation signal in the Z direction so as to sweep the oscillation wavelength within a certain bandwidth of the wavelength with the center wavelength maintained constant regardless of environmental changes.

In this way, by providing the second reflector 800 that handles a relatively large drive range and the movable reflector structure 800X that handles a relatively small drive range (by dividing the functions), the gap between the half-VCSEL element 100 (first reflector 400) and the second reflector 800 can be controlled with higher accuracy.

This configuration further improves the linearity of the oscillation wavelength with respect to the drive voltage and enables light having a desired oscillation wavelength.

The movable reflector structure 800X for high-speed driving is provided with piezoelectric elements. Applying the voltage that continuously fluctuates with time and a modulation signal that periodically changes into the piezoelectric elements enables the movable reflector structure to displace in the Z direction at a drive speed of tens to hundreds of nanometers on the order of MHz.

Figure 15A:
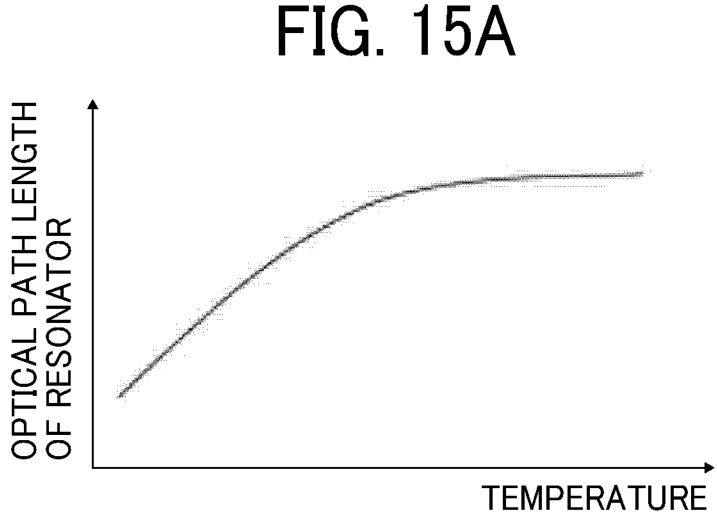
FIG. 15A is a graph of a relation between a temperature and a cavity length in the tunable laser according to an embodiment of the present disclosure.
Figure 15B:
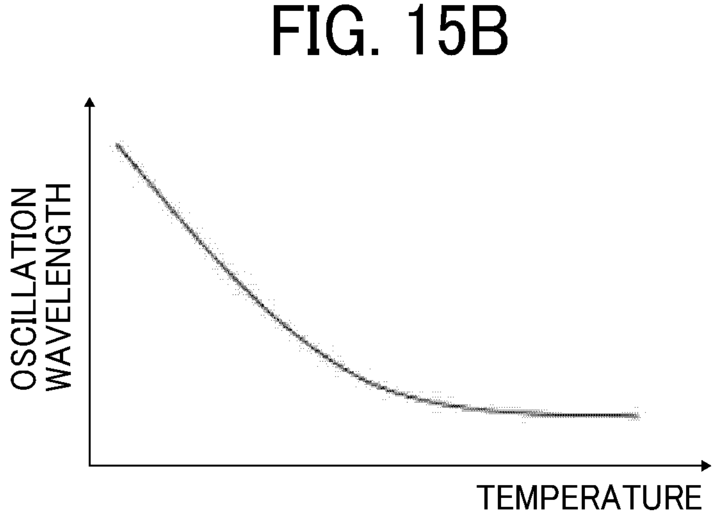
FIG. 15B is a graph of the relation between a temperature and a wavelength in the tunable laser according to an embodiment of the present disclosure.

FIG. 15A is a graph of the relation between the optical path length of the resonator and the temperature in the tunable laser according to an embodiment of the present disclosure. FIG. 15B is a graph of the relation between the oscillation wavelength and the temperature. With a change in the temperature of the tunable laser due to, for example, environmental temperature changes or heat generated by a module of the laser, a difference in thermal expansion coefficient between the material of the movable reflector element and the material of the half-VCSEL element changes the length of the gap tuning region between the movable reflector element and the half-VCSEL element.

Figure 30:
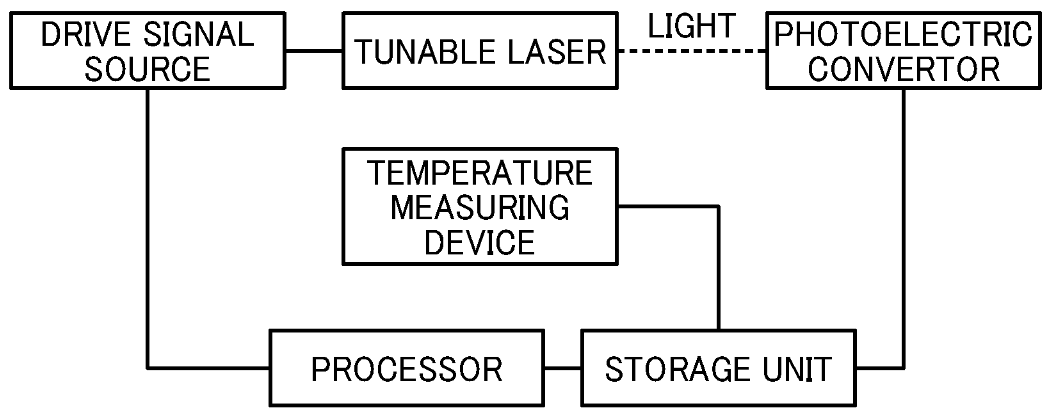
FIG. 30 is a block diagram of calibration of plane parallelism between the movable reflector element and the half-VCSEL element.

Further, the change in the temperature of the tunable laser also changes the refractive index of the material (e.g., semiconductor material) forming the resonator of the movable reflector element and the half-VCSEL element, causing the optical path length of the resonator of the tunable laser to vary. Using recorded data on the variation in the wavelength with changes in the temperature, a voltage to be applied to the piezoelectric elements of the meandering structure connected to the second reflector is distorted in advance to keep the wavelength constant with the temperature, thus reducing the variation in wavelength with the temperature. FIG. 30 is a functional block diagram of wavelength correction. For example, a temperature measuring device is disposed near a light source to measure the temperature of or near the tunable laser during its oscillation. A storage unit in FIG. 30 stores, as a correlation formula or a table, the relation between the wavelength, the output power, and the temperature of the tunable laser during oscillation, and also stores the relation between the drive voltage and the oscillation wavelength of the piezoelectric elements. The processor determines a correction voltage for which the oscillation wavelength is constant with temperature, or the output power becomes maximum, based on the relation between the temperature and the wavelength measured and stored in the storage unit. According to that voltage, a drive signal source drives a piezoelectric element.

Such an adjustment method is applicable when the length of the gap tuning region changes by a large amount of, for example, several hundreds of nanometers. To deal with the change of the above-described order, a sufficient amount of displacement cannot be obtained to cancel out the amount of the change with the temperature by using a static voltage to actuate the movable reflector structure 800X that handles a relatively small drive range.

In view of such a situation, with the position of the second reflector being statically adjusted with the temperature, the movable reflector structure 800X that handles a relatively small drive range is actuated at a high speed by a modulation signal of, for example, a sine wave. This can sweep the wavelength at a high speed while maintaining the central wavelength with changes in temperature.

As described above, the optical device of the present embodiment includes the first reflector, the second reflector, the elastic support unit that supports the second reflector, and the piezoelectric element provided in the elastic support unit.

By applying a drive voltage to the piezoelectric element to elastically deform the elastic support unit, the distance between the first reflector the second reflector is changed, and the oscillation wavelength of light emitted by the light emitting portion is changed.

The reflector on the MEMS side to control the cavity length that determines the wavelength of light is connected to the elastic meandering structure in which the piezoelectric element is formed.

As a result, the linearity of the oscillation wavelength with respect to the drive voltage is improved and the light with a desired oscillation wavelength is obtained.

The present invention is not limited to the above embodiments, and can be modified in various ways.

The size, the shape, the function, and the like of the components illustrated in the accompanying drawings are not limited to the above embodiments, and can be appropriately changed within the effects of the present invention.

In addition, the size, the shape, the function, and the like of the components illustrated in the accompanying drawings can be appropriately modified and implemented as long as the size, the shape, the function, and the like of the components illustrated in the accompanying drawings does not deviate from the purpose of the present invention.

In the above embodiment, the support unit is formed as the meandering structure that includes the two arms extending adjacent to each other and one folded portion connecting the ends on the same side of the two arms in the extending direction of the arms, and the piezoelectric elements are formed on the two arms.

In the above embodiment, the support unit is formed as the meandering structure that may include three or more arms extending adjacent to each other and two or more of folded portions each connecting the ends on the same side of two adjacent arms of the three or more of arms in the extending direction, and the piezoelectric elements are formed on the three or more of arms.

The elastic support unit includes a plurality of arms extending adjacent to each other and a folded portion for connecting the ends on the same side of the plurality of arms in the extending direction, and the piezoelectric element is displaced on the plurality of arms.

In the above embodiment, the case where two or four elastic support units are provided apart from each other around the second reflector has been described as an example, but there is a latitude in the number of the elastic support units separate from each other around the second reflector, and various design changes are possible.

For example, at least two elastic support units may be provided or at least three elastic support units may be provided so as to be apart from each other around the second reflector.

In the conventional MEMS tunable laser, when the plane parallelism between the light emitter (e.g., the half-VCSEL element) and the movable reflector element (e.g., the MEMS mirror) is low, that is, the plane parallelism between the two reflectors (i.e., the first mirror and the second mirror) is low, the threshold current for laser emission becomes high.

In particular, in the MEMS tunable laser using electrostatic attraction, the parallelism between two mirrors is tend to be low and the threshold current for laser emission is tend to be high, and since the accuracy of the plane parallelism is fixed at the time of joining, an sufficient emission intensity cannot be obtained.

In the modified example, the plane parallelism of two reflectors, in other words, the plane parallelism between the emitting unit and the reflector can be improved.

According to the modified example, the plane parallelism of two reflectors, in other words, the plane parallelism between the emitting unit and the reflector can be improved.

In the conventional MEMS tunable laser, the plane parallelism between the light emitter (e.g., the half-VCSEL element) and the movable reflector element (e.g., the MEMS mirror) is low, that is, the two reflectors (first and second) is low. The parallelism between the two reflectors causes a high threshold current of laser emission.

In particular, in the MEMS tunable laser using electrostatic attraction, the parallelism between two mirrors is tend to be low and the threshold current for laser emission is tend to be high, and since the accuracy of the plane parallelism is fixed at the time of joining, an sufficient emission intensity cannot be obtained.

A cause of degrading the plane parallelism between the light emitter (e.g., the half-VCSEL element) and the movable reflector element (e.g., the MEMS mirror) comes from mounting conditions at the time of device integration.

In the MEMS tunable laser, the light emitter (e.g., the half-VCSEL element) and the movable reflector element (e.g., the MEMS mirror) are integrated in a single device, and a gap is disposed between the light emitter and the movable reflector element.

Among the ultra-high reflectors possessed by each element, a wavelength sweep function is added to the oscillating light by injecting a current into the half-VCSEL while slightly driving the reflector on the MEMS side in the direction perpendicular to the element surface.

The integration method is classified into a laminated method and a bonding method. The bonding method uses a bonding layer for bonding the two elements, and the plane parallelism of the two elements changes depending on the film thickness variation, the bonding temperature, and pressure.

A film formation method such as sputtering or evaporation is used to form the bonding layer. In the film formation, the film thickness varies depending on the film formation position. Heating and pressurizing are required to join the bonding layers formed on each element. There are positional variations on heating and pressurizing conditions.

The bonding layer bonding the light emitter and the movable reflector element does not uniformly deform and varies in thickness. This reduces the plane parallelism between the light emitter (e.g., the half-VCSEL element) and the movable reflector element (e.g., the MEMS mirror).

In a laser element such as the half-VCSEL that has a resonator in the direction perpendicular to the plane, a low threshold current, a low power consumption, and a high output are achieved by reducing the loss of light that oscillates between the resonator includes two reflectors.

Therefore, in the tunable laser containing the device structure as described above, a tilt in the parallelism between the elements, for example, two reflectors, increases the loss of light by that amount of tilt and the threshold current increases.

In the present embodiment, at least three elastic support units (e.g., 910, 920, and 930) are included as the elastic support unit 900 for supporting the second reflector 800, and piezoelectric elements (e.g., 1010, 1020, and 1030) are disposed on at least three elastic support units (e.g., 910, 920, 930), respectively.

Then, an independent drive signal is applied to at least three piezoelectric elements (e.g., 1010, 1020, and 1030) of three elastic support units (e.g., 910, 920, and 930), and by independently elastically deforming at least three elastic support units (e.g., 910, 920, and 930), the plane parallelism between the first reflector 400 and the second reflector 800, in other words, the plane parallelism between the half-VCSEL element 100 and the second reflector 800, is changed.

In the present embodiment, the number of elastic bodies connecting the MEMS-side reflector and the chip support unit is three or more, and each elastic body is driven by an independent signal.

In this structure of the present embodiment, the driving amount of each elastic body is independently changed according to the tilt of a chip, so that the positions of the reflector and the plurality of connecting portions of the elastic body in the direction perpendicular to the chip surface are changed.

By forming the reflector with a highly rigid material, the positional difference in the connecting portion can be changed to the tilt of the reflector.

By using this change to drive the elastic body so as to cancel the tilt between the elements, the loss of light in the resonator structure can be reduced.

Figure 16:
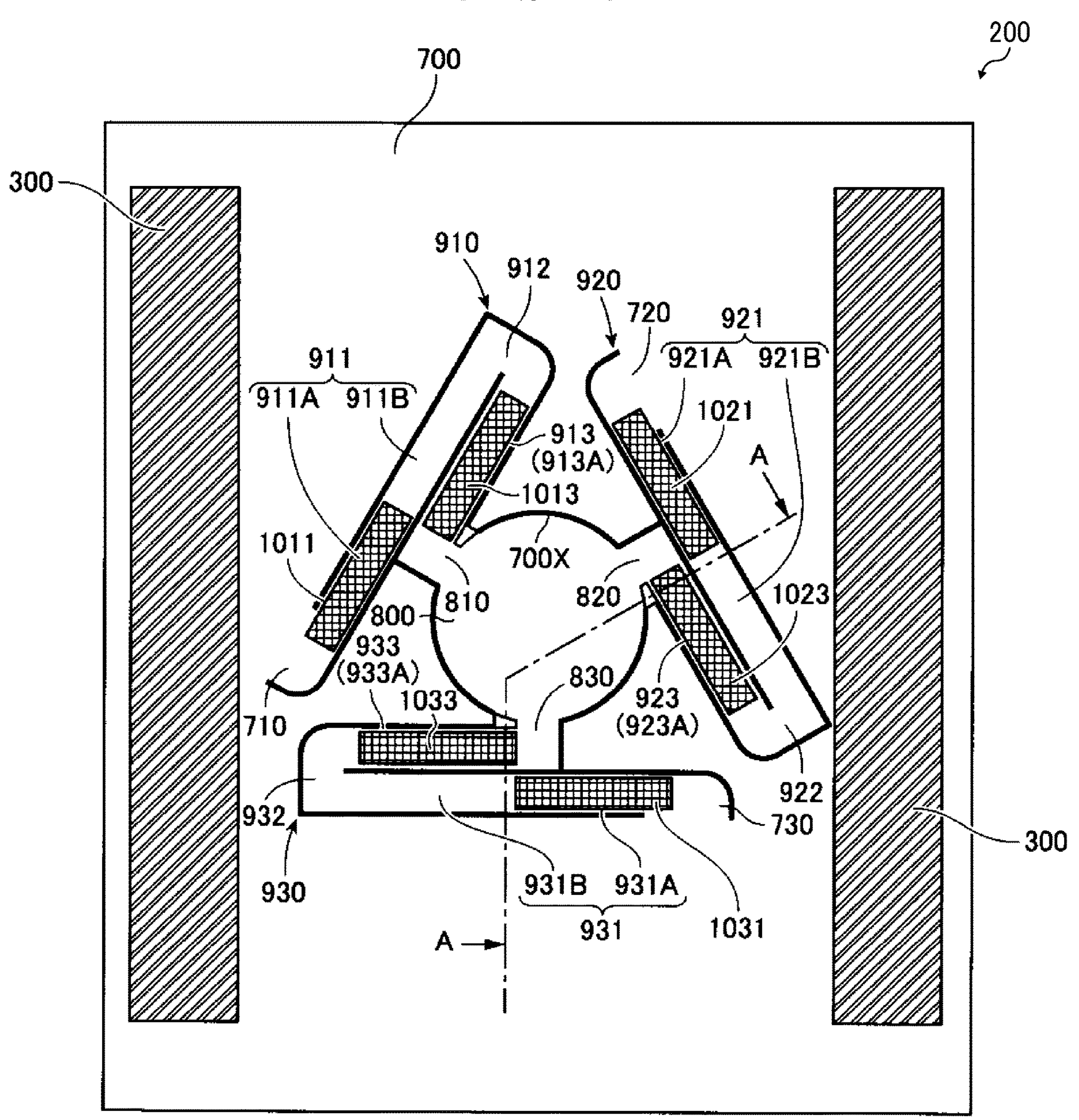
FIG. 16 is a plan view of an example of the support structure of a second reflector.

FIG. 16 is a plan view of the support structure of the second reflector 800 (i.e., support structure of the MEMS side reflector).

Figure 17:
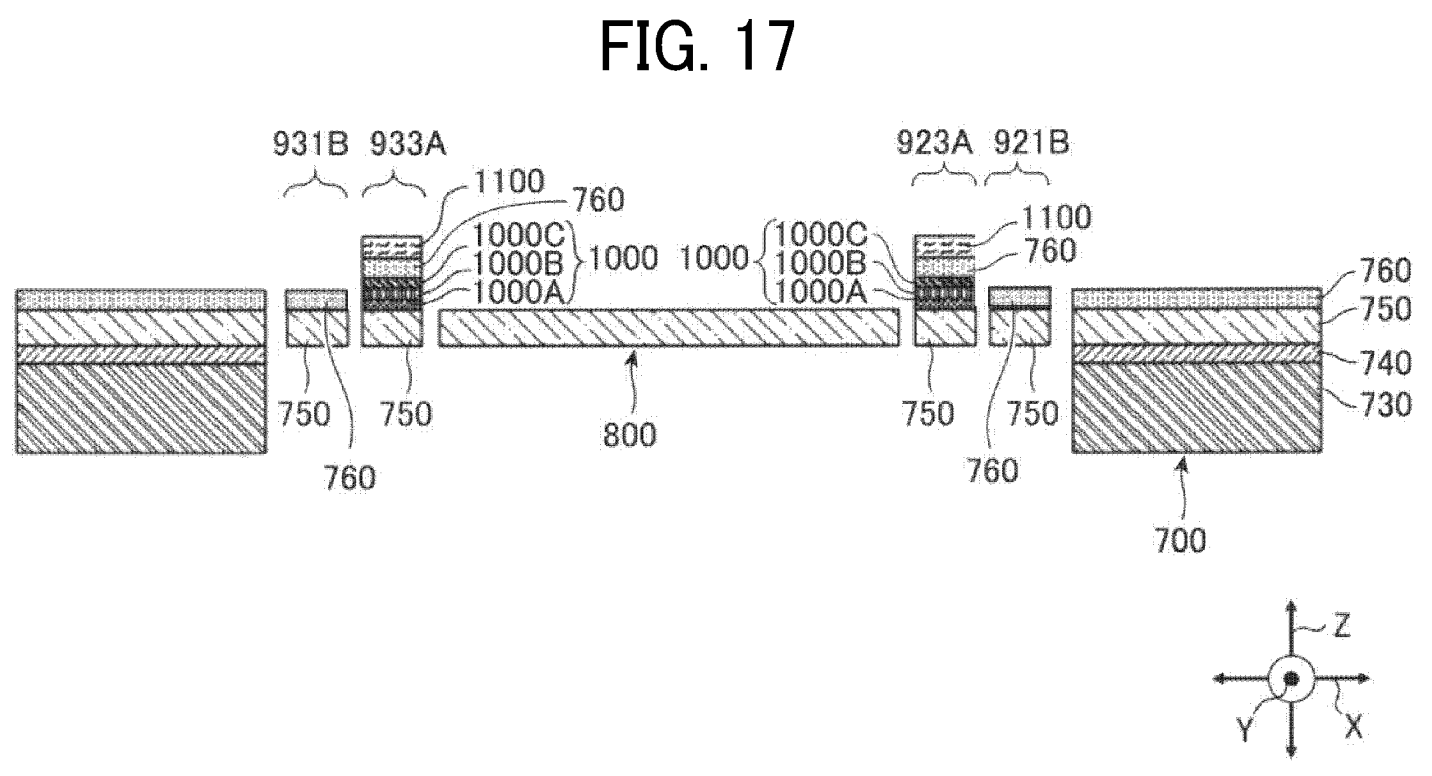

FIG. 17 is a cross-sectional view of the support structure of the second reflector 800 taken along the line AA of FIG. 16.

As illustrated in FIG. 16, the second reflector 800 is supported in a floating state with a through hole 700X in the central portion of the stationary support unit 700 extending in the XY plane.

The connecting end 810, the connecting end 820 and the connecting end 830 are formed to protrude around the second reflector 800, and in the stationary support unit 700, a connecting portion 710, a connecting portion 720 and a connecting portion 730 are formed to protrude around the second reflector 800.

The connecting end 810 and the connecting portion 710 are connected by the elastic support unit 910, the connecting end 820 and the connecting portion 720 are connected by the elastic support unit 920, and the connecting end 830 and the connecting portion 730 are connected by the elastic support unit 930.

A set of the elastic support unit 910, the connection end 810, and the connecting portion 710, a set of the elastic support unit 920, the connection end 820, and the connecting portion 720, and a set of the elastic support unit 930, the connection end 830, and the connecting part 730 are disposed at equal or nearly equal intervals (180° intervals) in the circumferential direction.

The elastic support unit 910 includes the first arm 911 extending to the upper right diagonal from the connecting portion 710, the folded portion 912 folded from the first arm 911, and the second arm 913 extending to the lower left diagonal from the folded portion 912 and connecting to the connecting end 810. In other words, the elastic support unit 930 forms a meandering structure.

A piezoelectric element 1011 is disposed on the left half of the first arm 911, and is a displacement portion 911A that elastically deforms when the drive voltage is applied to the piezoelectric element 1011.

The piezoelectric element 1011 is not disposed on the right half of the first arm 911, and is a displacement defining portion 911B that does not elastically deform when the drive voltage is applied to the piezoelectric element 1011.

The second arm 913 is provided with a piezoelectric element 1013, and is a displacement portion 913A that elastically deforms when a drive voltage is applied to the piezoelectric element 1013.

As described above, the elastic support unit 910 includes the first arm 911 and the second arm 913 extending adjacent to each other, and the folded portion 912 connecting the ends of the first arm 911 and the second arm 913 in the extending direction. The piezoelectric element 1011 is disposed on the first arm 911 and the piezoelectric element 1013 is disposed on the second arm 913.

The piezoelectric element 1011 and the piezoelectric element 1013 are provided so as not to be arranged in a direction orthogonal to the extending direction of the first arm 911 and the second arm 913.

The piezoelectric element 1010 contains a set of the piezoelectric element 1011 and the piezoelectric element 1013.

The elastic support unit 920 includes the first arm 921 extending to the lower right diagonal from the connecting portion 720, the folded portion 922 folded from the first arm 921, and the second arm 923 extending to the upper right diagonal from the folded portion 922 and connecting to the connecting end 820. In other words, the elastic support unit 920 forms a meandering structure.

A piezoelectric element 1021 is disposed on the left half of the first arm 921, and is a displacement portion 921A that elastically deforms when the drive voltage is applied to the piezoelectric element 1021.

The piezoelectric element 1021 is not disposed on the right half of the first arm 921, and is the displacement defining portion 921B that does not elastically deform when the drive voltage is applied to the piezoelectric element 1021.

The second arm 923 is provided with a piezoelectric element 1023, and is a displacement portion 923A that elastically deforms when the drive voltage is applied to the piezoelectric element 1023.

As described above, the elastic support unit 920 includes the first arm 921 and the second arm 923 extending adjacent to each other, and the folded portion 922 connects the ends on the same side of the first arm 921 and the second arm 923 in the extending direction. The piezoelectric element 1021 is disposed on the first arm 921 and the piezoelectric element 1023 is disposed on the second arm 923.

The piezoelectric element 1021 and the piezoelectric element 1023 are provided so as not to be arranged in a direction orthogonal to the extending direction of the first arm 921 and the second arm 923.

The piezoelectric element 1020 contains a set of the piezoelectric element 1021 and the piezoelectric element 1023.

The elastic support unit 930 includes the first arm 931 extending to the left from the connecting portion 730, the folded portion 932 folded downward from the first arm 931, and the second arm 933 extending to the right from the folded portion 932 and to the connecting end 830. In other words, the elastic support unit 930 forms a meandering structure.

A piezoelectric element 1031 is disposed on the right half of the first arm 931, and is a displacement portion 931A that elastically deforms when the drive voltage is applied to the piezoelectric element 1031.

The piezoelectric element 1031 is not disposed on the left half of the first arm 931, and is the displacement defining portion 931B that does not elastically deform when the drive voltage is applied to the piezoelectric element 1031.

The second arm 933 is provided with a piezoelectric element 1033, and is a displacement portion 933A that elastically deforms when the drive voltage is applied to the piezoelectric element 1033.

As described above, the elastic support unit 930 includes the first arm 931 and the second arm 933 extending adjacent to each other, and the folded portion 932 connecting the ends on the same side of the first arm 931 and the second arm 933 in the extending direction. The piezoelectric element 1031 is disposed on the first arm 931, and the piezoelectric element 1033 is disposed on the second arm 933.

The piezoelectric element 1031 and the piezoelectric element 1033 are provided so as not to be arranged in a direction orthogonal to the extending direction of the first arm 931 and the second arm 933.

The piezoelectric element 1030 contains a set of the piezoelectric element 1031 and the piezoelectric element 1033.

As illustrated in FIG. 17, the stationary support unit 700 includes a support layer 730, an oxide insulating layer 740, a silicon active layer 750, and an insulating layer 760 laminated in this order from the lower layer side to the upper layer side in the Z direction.

The displacement defining portion 921B and the displacement defining portion 931B include the silicon active layer 750 and the insulating layer 760 laminated in this order from the lower layer side to the upper layer side in the Z direction. The laminated structure of the displacement defining portion 912B and the displacement defining portion 931B is partially common with the stationary support unit 700.

The displacement portion 923A (including the piezoelectric element 1023) and the displacement portion 933A (including the piezoelectric element 1033) includes an actuator in which the piezoelectric element 1000 is formed on the upper surface of the silicon active layer 750.

The piezoelectric element 1000 includes a lower electrode 1000A, a piezoelectric material 1000B, and an upper electrode 1000C laminated in this order from the lower layer side to the upper layer side in the Z direction.

By applying the drive voltage to the lower electrode 1000A and the upper electrode 1000C, the displacement portion 923A and the displacement portion 933A are elastically deformed. The insulating layer 760 and a protective film 1100 are disposed on the upper surface of the piezoelectric element 1000 (the upper electrode 1000C).

In the present embodiment, by applying a drive voltage to the piezoelectric elements 1011, 1013, 1021, 1023, 1031, and 1033 to elastically deform the elastic support units 910, 920, and 930, the distance between the first reflector 400 and the second reflector 800 (in other words, the half-VCSEL element 100 and the second reflector 800) is changed to change the oscillation wavelength of light emitted by the half-VCSEL.

With displacement generated by combinations of the actuators (the piezoelectric elements 1011, 1013, 1021, 1023, 1031, and 1033) on the meandering structure, the displacement defining portions 911B, 931B, and 921B, and the folded portions 912, 922, and 932 via the connecting ends 810, 820, and 830, the second reflector 800 as a movable reflector translationally moves in the Z direction while maintaining the parallelism between the stationary support unit 700 and the second reflector 800.

This translation in the Z direction is executed by generating the potential difference by applying the drive voltage to the lower electrode 1000A and the upper electrode 1000C of the actuator.

When the drive voltage (e.g., the same voltage) is applied to the piezoelectric element, the volume of the piezoelectric element changes.

Since the piezoelectric element and the arm are physically connected, an in-plane stress is generated in the vicinity of the piezoelectric element of the arm.

The arm stressed elastically deforms to relieve the stress.

At this time, to add an anisotropy to a dimension ratio of the arm in the XY direction, and to shorten the thickness of the arm in the Z direction make the arm warp dominantly in the Z direction, and the piezoelectric element also warps in the Z direction with keeping a predetermined radius of curvature.

The warp of the arm generated by the piezoelectric element is transmitted to the displacement defining portion without the piezoelectric element.

Thought the displacement defining portion warps in the Z direction due to gravity, this warp can be ignored because the warp by gravity is sufficiently small with respect to the warp of the piezoelectric element (equivalent to a negligibly small elastic deformation).

Figure 18:
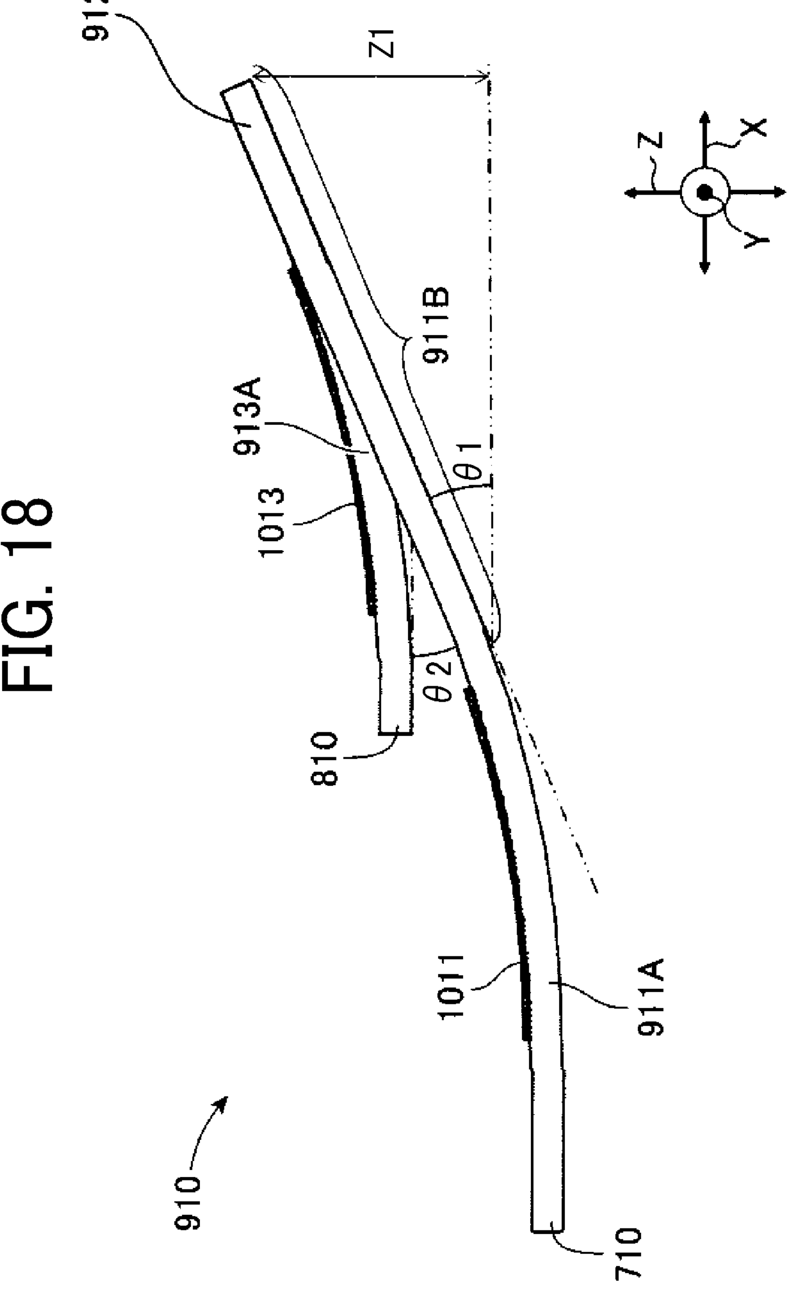
FIG. 18 is a side view illustrating a driving state of the second reflector in the support structure of FIGS. 15 and 16.

FIG. 18 is a side view illustrating a driving state of the second reflector 800 in the support structure of FIG. 16 and FIG. 17.

FIG. 18 is an enlarged view of the elastic support unit 910 as an example, and the elastic support units 920 and 930 have the similar configuration.

In FIG. 18, the displacement Z1 of the folded portion 912 of the elastic support unit 910 in the Z direction increases the deflection generated by the piezoelectric elements 1011 and 1013, or reduces the radius of curvature of the first arm 911. The displacement defining portion 911B of the first arm 911 may be lengthened, or both may be implemented.

The first arm 911 tilts toward the folded portion 912 at an angle θ1 from a free state, and after the folded portion 912 is hold back, the second arm 913 tilts at an angle θ2 from the free state (the difference between the angle θ1 and the angle θ2 is the tilt angle between the first arm 911 and the second arm 913).

When a piezoelectric element with the same dimension as the piezoelectric element of the first arm 911 formed on the second arm 913 drives, the tilt of the first arm 911 is canceled. Therefore, at the connection end 810 disposed at the end of the second arm 913, the second reflector 800 as a movable reflector can be moved in the Z direction with maintaining the parallelism between the XY plane of the stationary support unit 700 and the second reflector 800 as a movable reflector.

The dimensions of the piezoelectric elements formed on the first arm 911 and the second arm 913 on the XY plane may or may not be the same.

When the dimensions of the piezoelectric elements formed on the first arm 921 and the second arm 923 on the XY plane is not the same, the voltage applied to each piezoelectric element is adjusted such that the warpage generated in each piezoelectric element is the same.

The drive voltage that applies to the piezoelectric element is a DC voltage and may alternatively be a sine waveform, a cosine waveform, or a triangular waveform whose voltage changes with time.

Under a condition that the modulation frequency of the voltage and the resonance frequency of the movable reflector element are separated from each other, the linearity of the displacement amount with respect to voltage is maintained as described above.

Piezoelectric elements are driven by applying a voltage, and there is a linearity between a voltage and a generated stress.

Since the generated stress and the amount of deformation of the arm also have the linearity, the applied voltage and the amount of displacement have the linearity.

Figure 19:
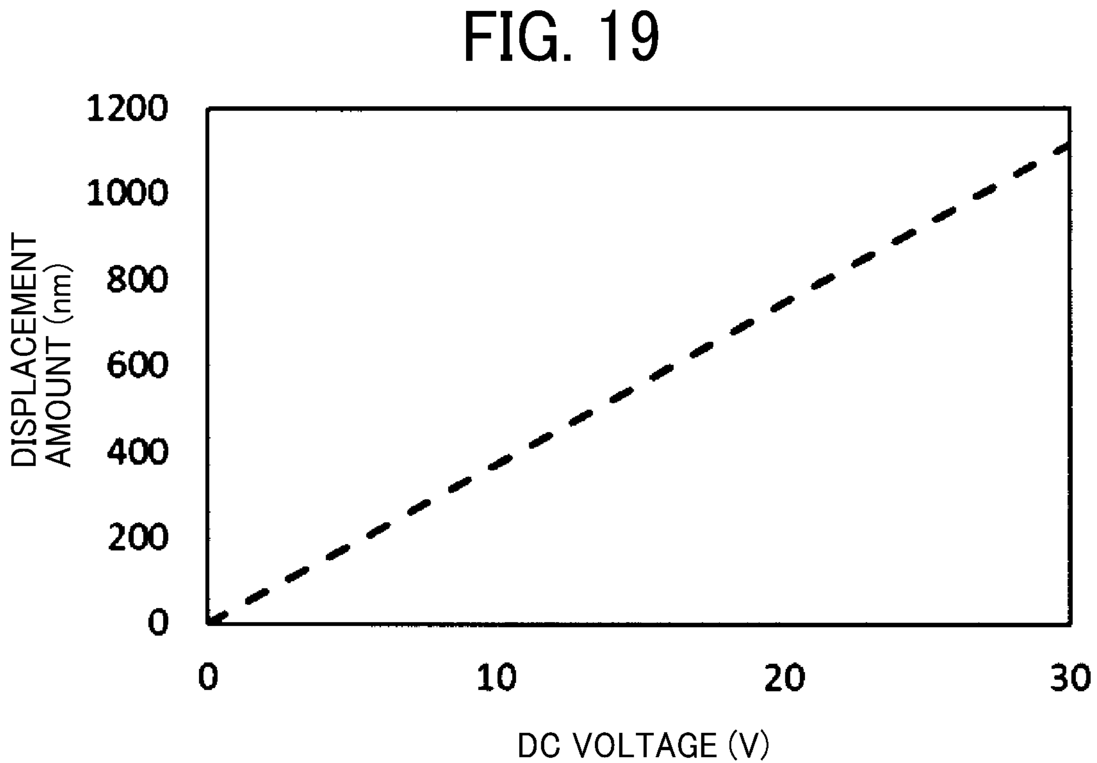
FIG. 19 is a graph of a relation between the drive voltage and a cavity length in the tunable laser according to an embodiment of the present disclosure.
Figure 20:
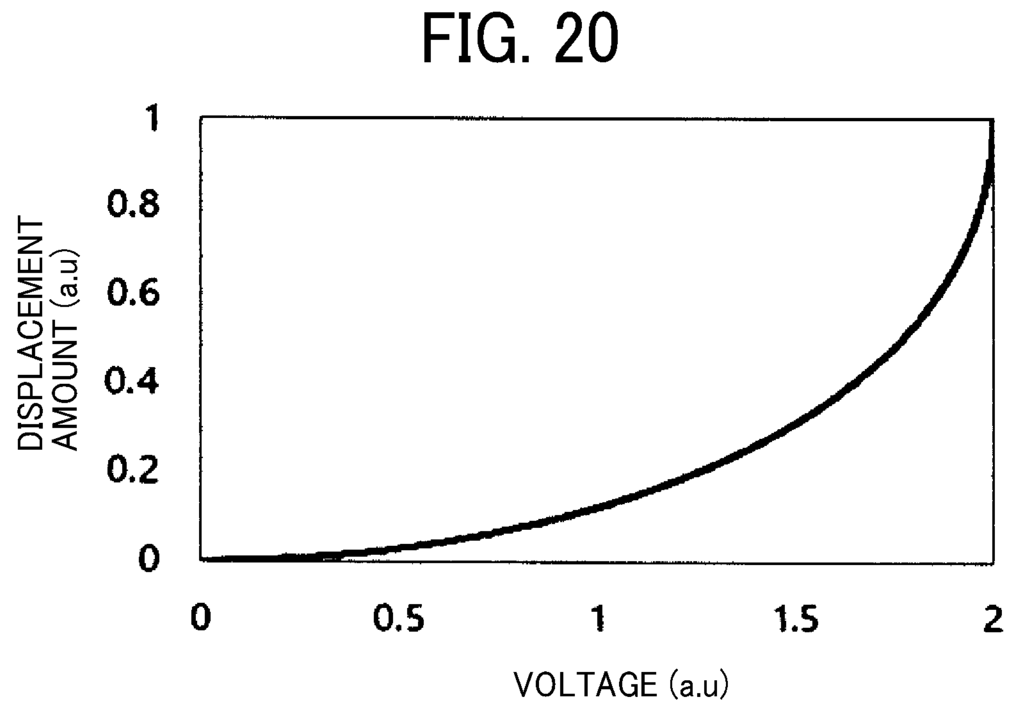
FIG. 20 is a graph of a relation between a drive voltage and a cavity length in a MEMS tunable laser using electrostatic attraction according to a comparative example.

FIG. 19 is a graph of the relation between the drive voltage and the cavity length in the tunable laser 10 of the present embodiment. FIG. 20 is a graph of the relation between the drive voltage and the cavity length in the conventional MEMS tunable laser using the electrostatic attraction.

As illustrated in FIG. 19, the tunable laser 10 according to the present embodiment achieves a high linearity between the drive voltage and the cavity length.

As illustrated in FIG. 20, in a MEMS tunable laser using the electrostatic attraction according to a comparative example, the position of the reflector on the MEMS side is proportional to the square of the drive voltage, and the films attract to each other when the gap between two reflectors displaces to ⅓ or more of the initial gap (i.e., pull-in effect). Such a pull-in effect causes an insufficient linearity between the driving voltage and the cavity length.

Figure 21:
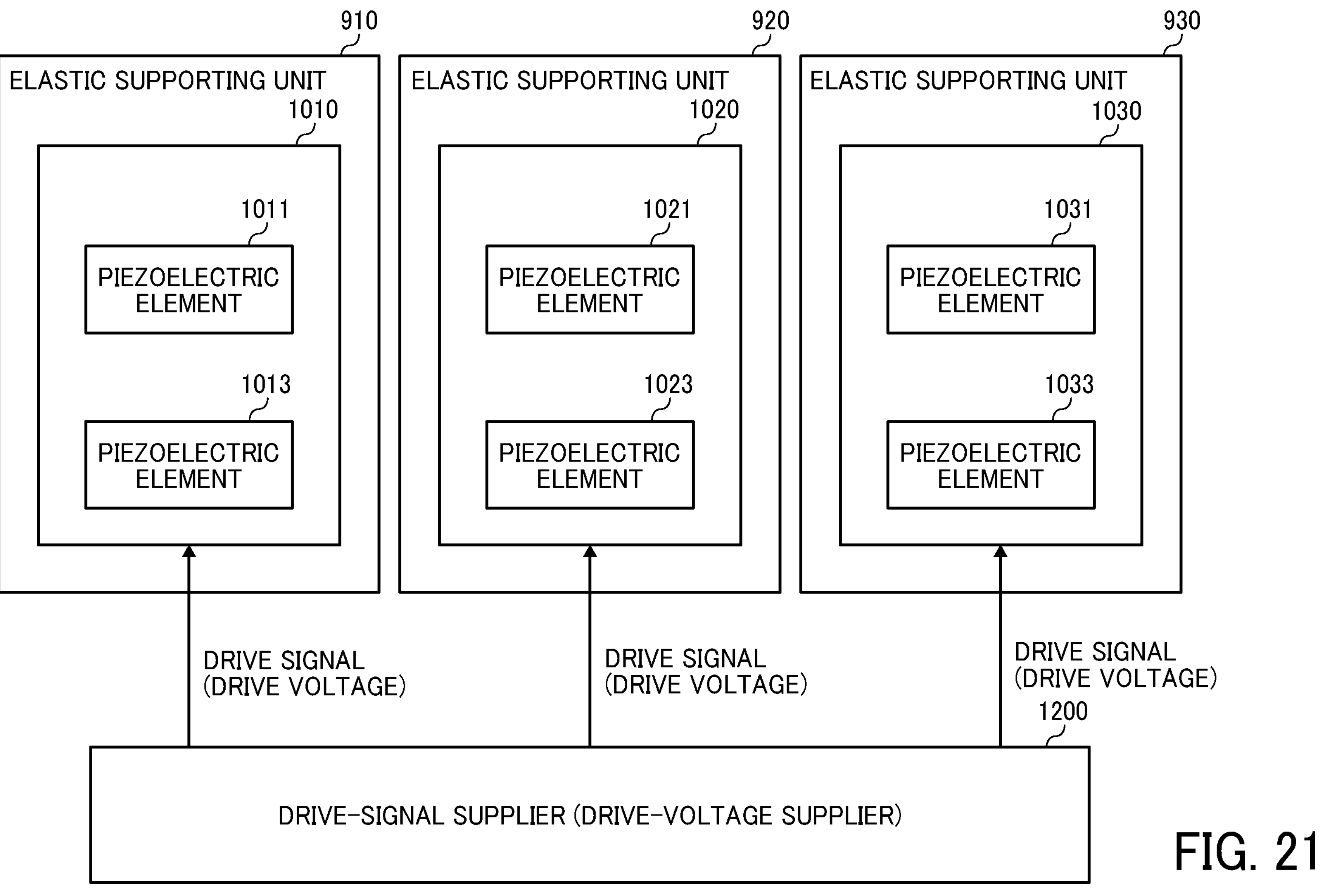
FIG. 21 is a functional block diagram of a configuration for supplying independent drive signals to piezoelectric elements of the three elastic support units.

FIG. 21 is a functional block diagram of a configuration to supply independent drive signals (drive voltages) to the piezoelectric elements 1010 to 1030 of the elastic support units 910 to 930.

As illustrated in FIG. 21, by applying an independent drive signal (a drive voltage signal) to the piezoelectric element 1010 (piezoelectric element 1011) of the elastic support unit 910. 1013, the piezoelectric element 1020 (piezoelectric element 1021, 1023) of the elastic support unit 920, and the piezoelectric element 1030 (piezoelectric element 1031, 1033) of the elastic support unit 930 by the drive signal supply unit (drive voltage supply unit) 1200 which is a functional component of the central processing unit (CPU), the elastic support units 910, 920, and 930 deform independently and the plane parallelism between the first reflector 400 and the second reflector 800 (i.e., the plane parallelism between the half-VCSEL element 100 and the second reflector 800) is changed.

The drive signal supply unit 1200 may further supply the drive signal (drive voltage signal) to the piezoelectric elements 1011 and 1013, which is independent of the drive signal (drive voltage signal) supplied to the piezoelectric element 1010 of the elastic support unit 910.

The drive signal supply unit 1200 may further supply the drive signal (drive voltage signal) to the piezoelectric elements 1021 and 1023, which is independent of the drive signal (drive voltage signal) supplied to the piezoelectric element 1020 of the elastic support unit 920.

The drive signal supply unit 1200 may further make the drive signal (drive voltage signal) supplied to the piezoelectric elements 1031 and 1033 independent of the drive signal (drive voltage signal) supplied to the piezoelectric element 1030 of the elastic support unit 930.

For example, when a part of the elastic support units 910, 920, and 930 is much closer to or much farther from the second reflector 800 (the half-VCSEL element 100) than the elastic support unit of the other portion, a part of the elastic support unit is used. By making the drive signal (drive voltage signal) supplied to the piezoelectric element of the elastic support unit different from the drive signal (drive voltage signal) supplied to the piezoelectric element of other parts, the postures (elasticity) of the elastic support units 910, 920, 930 are made different from each other. Adjusting whether or not to deform, the degree and direction of elastic deformation, etc.), the plane parallelism of the first reflector 400 and the second reflector 800 (the half-VCSEL element 100 and the second The plane parallelism of the reflector 800) can be optimally set.

The drive signal supply unit 1200 can improve the plane parallelism of the first reflector 400 and the second reflector 800 (the plane parallelism of the half-VCSEL element 100 and the second reflector 800) based on the tilt of the first reflector 400 to the second reflector 800 by supplying independent drive signals (drive voltage signals) to the piezoelectric element 1010 (piezoelectric elements 1011 and 1013), the piezoelectric element 1020 (piezoelectric elements 1021 and 1023), and piezoelectric element 1030 (piezoelectric elements 1031 and 1033) of the elastic support units 910, 920, and 930, respectively, to elastically deform the elastic support unit 910, 920, and 930.

The drive signal supply unit 1200 can improve the half-VCSEL element (light emitter) 100 based on the intensity of light from the half-VCSEL element (light emitter) 100 by supplying independent drive signals (drive voltage signals) to the piezoelectric element 1010 (piezoelectric elements 1011 and 1013), the piezoelectric element 1020 (piezoelectric elements 1021 and 1023), and piezoelectric element 1030 (piezoelectric elements 1031 and 1033) of the elastic support units 910, 920, and 930, respectively, to elastically deform the elastic support units 910, 920, and 930.

There is a latitude in the method of detecting the intensity of light emitted by the half-VCSEL element (light emitter) 100. For example, an external detection device (e.g., photodiode) that detects the reflectance of the first reflector 400 and the second reflector 800 can be used.

The tilt adjustment of the second reflector 800 by the drive signal supply unit 1200 can be performed at the time of manufacturing or mounting the tunable laser 10.

Alternatively, after manufacturing or mounting, the tilt of the second reflector 800 can be adjusted by the drive signal supply unit 1200 at startup or at predetermined time interval according to surrounding environment (e.g., material or temperature).

The drive signal supply unit 1200 may be either an internal component or an external component of the tunable laser 10, and there is a latitude in the specific aspect. The drive signal supply unit is not limited to the example of FIG. 21.

Figure 22:
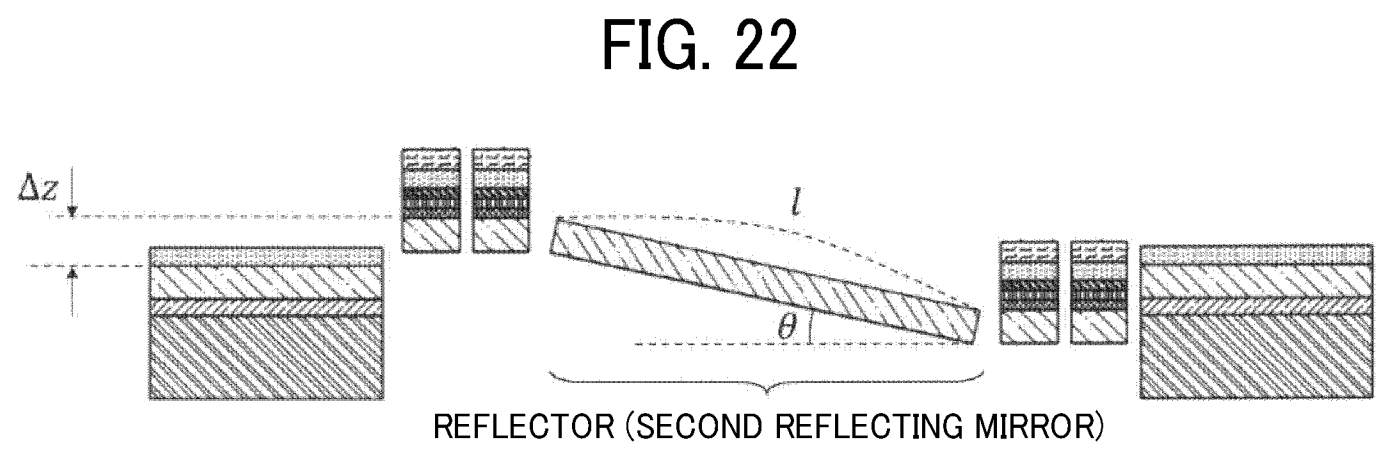

FIG. 22 is a diagram of an example of an operation in which different voltages are applied to the two connecting portions to give the reflector (e.g., the second reflector 800) a tilt of θ.

As illustrated in FIG. 22, when one connecting portion is displaced in the +Z direction and the other connecting portion is displaced in the −Z direction, the reflector (the second reflector 800) tilts by θ with respect to a tilt with non-driving state.

The generated title depends on the displacement amount Δz of the connecting portion and the distance between the connecting ends, and the relation is $\theta=\arcsin(2\cdot\Delta z/l)$.

Figure 23:
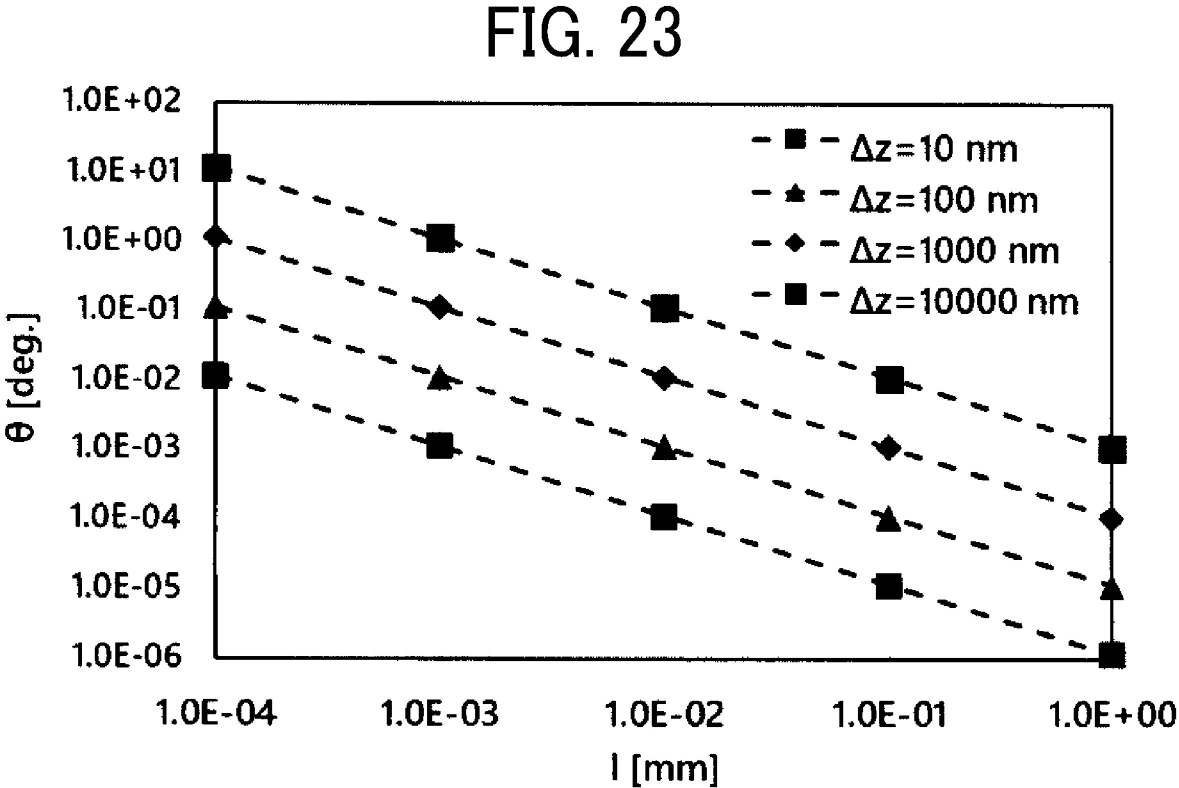
FIG. 23 is a diagram of an example of the relation between the displacement amount of the connecting portion and the tilt obtained when the distance between the connecting ends is changed.

FIG. 23 is a graph of the relation between the displacement amount of the connecting portion and the title angle obtained when the distance between the connecting ends is changed.

By appropriately setting the displacement amount of the connecting portion and the distance between the connecting ends, a tilt (of the first reflector 400 and the second reflector 800) actually generated in mounting process can be absorbed.

When the same offset voltage is further applied while different voltages are applied to a plurality of connecting portions, the mirror portion can be driven in the Z direction with maintaining its tile according to the linearity of the voltage and the displacement amount described above.

Therefore, sweeping of the wavelength with the appropriate tilt of the reflector for the laser oscillation maintained is possible.

Figure 24A:
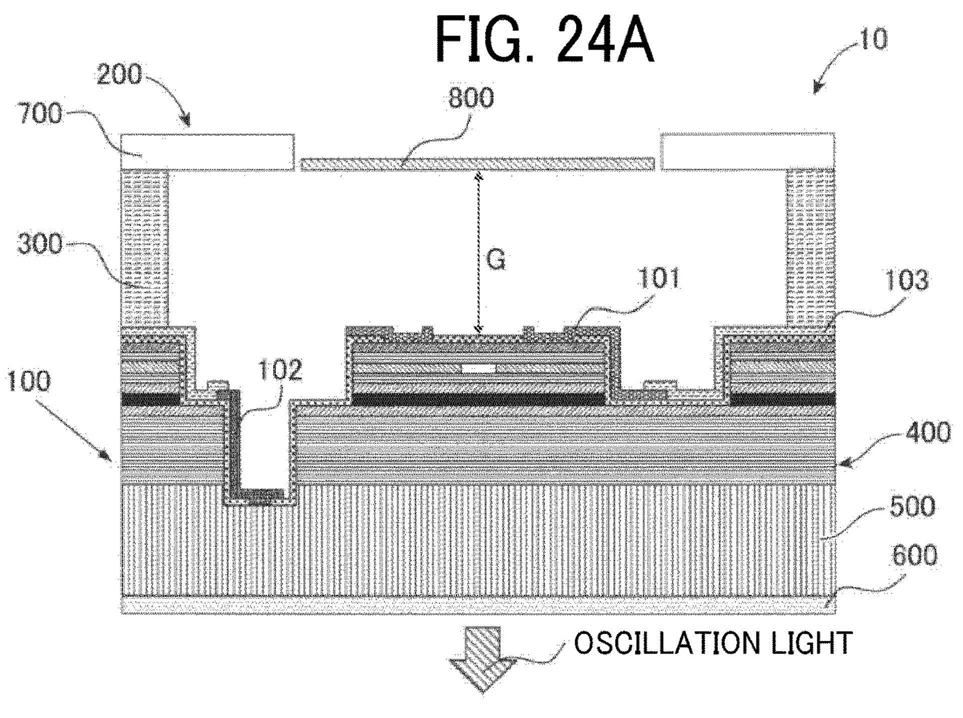
FIG. 24A and FIG. 24B are illustrations for describing wavelength sweeping by the tunable laser in FIG. 1, according to an embodiment of the present disclosure.
Figure 24A:
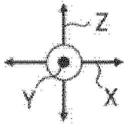
Figure 24B:
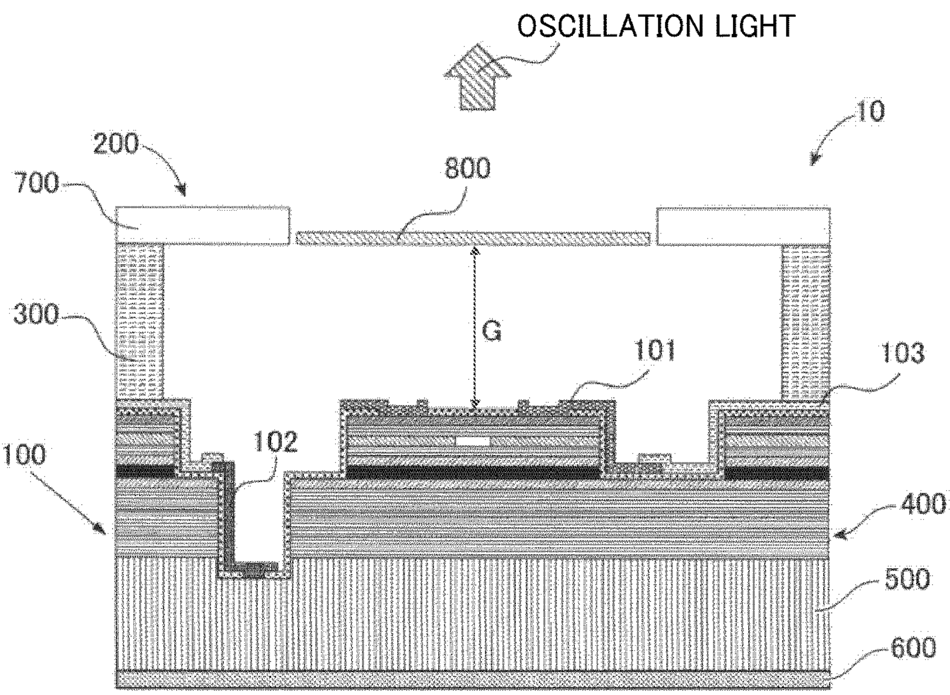
Figure 24B:
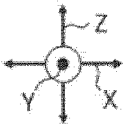

FIG. 24A and FIG. 24B are diagrams of an example of wavelength sweeping by the tunable laser 10 of the present embodiment.

The laser oscillation wavelength of the tunable laser 10 is defined by an emission spectrum (i.e., a wavelength distribution) characteristic in materials constituting the active layer 105 and the resonator structure.

The resonator structure is characterized by the distance G in the Z direction between the first reflector 400 and the second reflector 800, and the refractive index and dimensions of the material existing between the first reflector 400 and the second reflector 800.

The active layer 105 emits light with the current injected into the half-VCSEL element 100 through the electrodes, and the wavelength of the resonant light (i.e., the oscillation light) changes with variation of the distance G between the first reflector 400 and the second reflector 800 in the Z direction.

FIG. 24A is a diagram illustrating a state in which the resonance light (i.e., the oscillation light) is directed downward in the Z direction, and FIG. 24B is a diagram illustrating a state in which the resonance light (i.e., the oscillation light) is directed upward in the Z direction.

Since the distance G between the first reflector 400 and the second reflector 800 in the Z direction can be changed by changing the position of the second reflector 800 as a movable reflector element in the Z direction, the wavelength of the resonant light (i.e., the oscillating light) can be modulated.

In particular, in the present embodiment, the distance G between the first reflector 400 and the second reflector 800 in Z the direction can be controlled with high accuracy by devising the support structure of the second reflector 800 by using the elastic support unit 900 and the piezoelectric element 1000.

As a result, the linearity of the oscillation wavelength with respect to the drive voltage is improved and the light with a desired oscillation wavelength is obtained.

Furthermore, by applying independent drive signal (drive voltage signal) to the piezoelectric element 1010 (piezoelectric element 1011, 1013) of the elastic support unit 910, the piezoelectric element 1020 (piezoelectric element 1021, 1023) of the elastic support unit 920, and the piezoelectric element 1030 (piezoelectric elements 1031, 1033) of the elastic support unit 930, the elastic support units 910, 920, and 930 are elastically deformed, and the plane parallelism of the first reflector 400 and the second reflector 800 (i.e., the plane parallelism of the half-VCSEL element 100 and the second reflector 800) can be improved.

Figure 25:
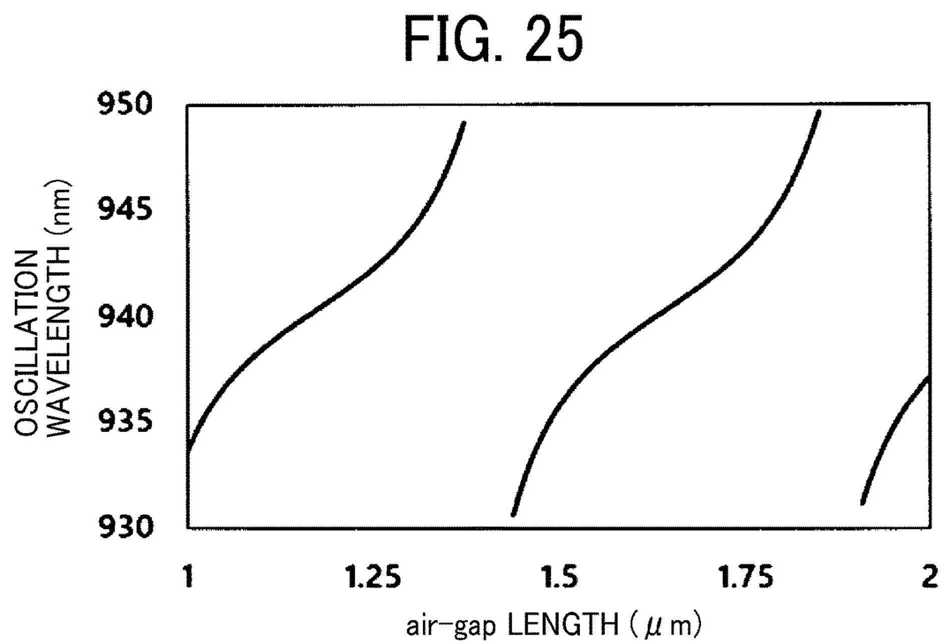
FIG. 25 is a graph of the simulation results of a relation between the length of the gap between the half-VCSEL element and the second reflector and the oscillation wavelength.

FIG. 25 is a graph of simulation results of the relation of the length of the gap (i.e., the distance) between the half-VCSEL element 100 (first reflector 400) and the second reflector 800, and the oscillation wavelength.

The oscillation light emitted by the half-VCSEL element 100 is emitted to the first reflector 400 or the second reflector 800, whichever has a lower reflectance.

Therefore, by adjusting the magnitude of the reflectance between the first reflector 400 and the second reflector 800, the emission direction of the oscillating light by the half-VCSEL element 100 can be adjusted.

For example, when the reflectance of the first reflector 400 is lower than the reflectance of the second reflector 800, the oscillating light is emitted downward in the Z direction (FIG. 24A). When the reflectance of the first reflector 400 is higher than the reflectance of the second reflector 800, the oscillating light is emitted upward in the Z direction (FIG. 24B).

A bonding layer including multilayer metal films containing a plurality of metals is formed on the half-VCSEL element 100 (the first reflector 400) and the second reflector 800, respectively.

For example, by bonding the bonding layers on each element with an atomic diffusion bonding method, a space can be obtained between the first reflector 400 and the second reflector 800.

The active layer 105 of the half-VCSEL element 100 is displaced in the center of the resonator structure, which is a position corresponding to the antinode in the standing wave of electric field to obtain a highly stimulated emission probability.

Figure 26:
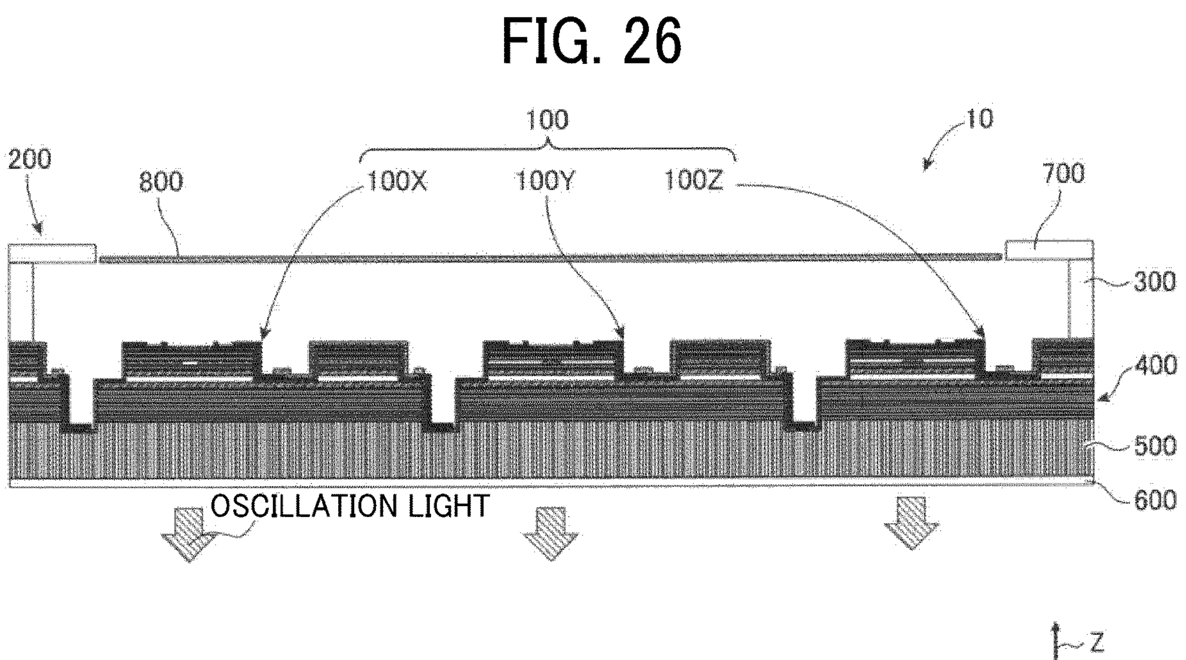
FIG. 26 is a diagram of a tunable laser according to a first modification of an embodiment of the present disclosure.

FIG. 26 is a diagram of a tunable laser 10 according to a first modification of an embodiment of the present disclosure.

As illustrated in FIG. 25, one second reflector 800 is provided with a plurality of the half-VCSEL elements 100.

Specifically, three half-VCSEL elements 100X, 100Y, and 100Z adjacent to each other in the X direction on the XY plane are provided with one second reflector 800.

The semiconductor substrate 500, and the antireflection film 600 may be shared these three half-VCSEL elements 100X, 100Y, and 100Z.

In the configuration of FIG. 26, when a current is injected into the three half-VCSEL elements 100X, 100Y, and 100Z with the reflector (e.g., the second reflector 800) tilted, cavity length for each element is inclined, and the oscillation wavelength is dispersed.

Further, by controlling amount of tilt of the reflector, the magnitude of wavelength dispersion can be controlled.

Figure 27:
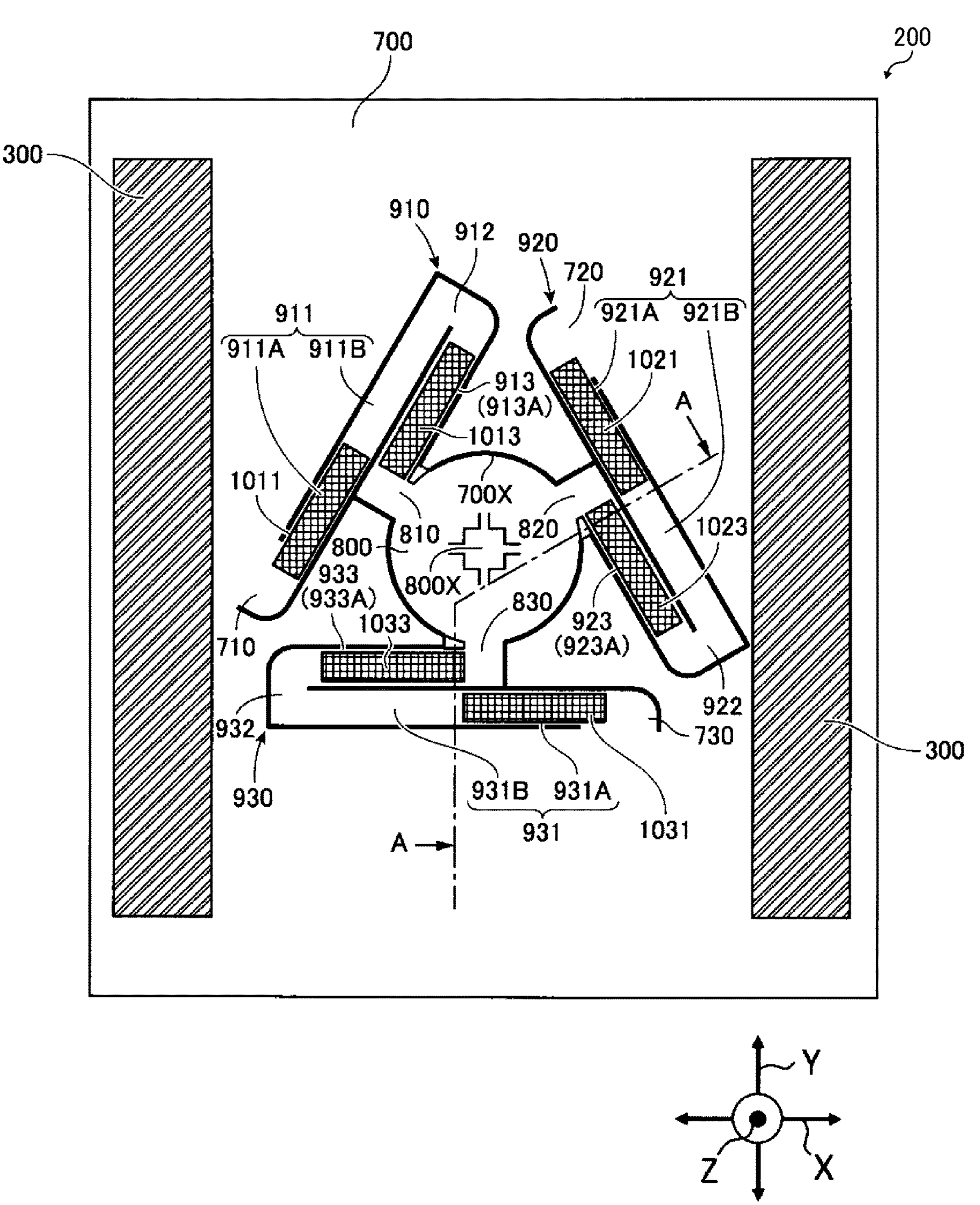
FIG. 27 is a diagram of a tunable laser according to a second modification of an embodiment of the present disclosure.

FIG. 27 is a diagram of a tunable laser 10 according to a second modification of an embodiment of the present disclosure.

As illustrated in FIG. 27, a movable reflector structure 800X for high-speed driving is added inside of the second reflector 800 as a movable reflector.

The length of the gap between the half-VCSEL element 100 (the first reflector 400) and the second reflector 800, which are bonded together with the bonding layer 300 therebetween, is changed with the usage environment (e.g., temperature) of the tunable laser 10.

The length change of this gap is several μm. A center of the oscillation wavelength is fixed by statically driving the meandering structure with a voltage prepared (preset) according to the usage environment (e.g., temperature) of the tunable laser 10.

Furthermore, after fixing the center wavelength, the movable reflector structure 800X for high-speed driving is displaced in the Z direction by several tens of nm in accordance with a modulation signal so as to sweep the oscillation wavelength within a certain bandwidth of the wavelength with keeping the center wavelength regardless of environmental changes.

As described above, by providing the second reflector 800 that handles a relatively large drive range and the movable reflector structure 800X that handles a relatively small drive range (i.e., by using two ranges), the gap between the half-VCSEL element 100 (the first reflector 400) and the second reflector 800 can be controlled with higher accuracy.

This configuration can further improve the linearity of the oscillation wavelength and the drive voltage, and thus enables light having a desired oscillation wavelength.

As illustrated in FIG. 22, if the reflector (e.g., the second reflector 800) is driven in the Z direction without correction of its tilt, the loss of light in the resonator may increase because only part of the reflected light is incident on the active layer. This makes it difficult to produce laser oscillation in a wavelength region with a small gain, thus narrowing the wavelength sweep width. To deal with such an issue, the tilt of the reflector is corrected to minimize the loss of light caused during the light reflection, so as to increase both the wavelength sweep width and the light intensity.

Figure 28A:
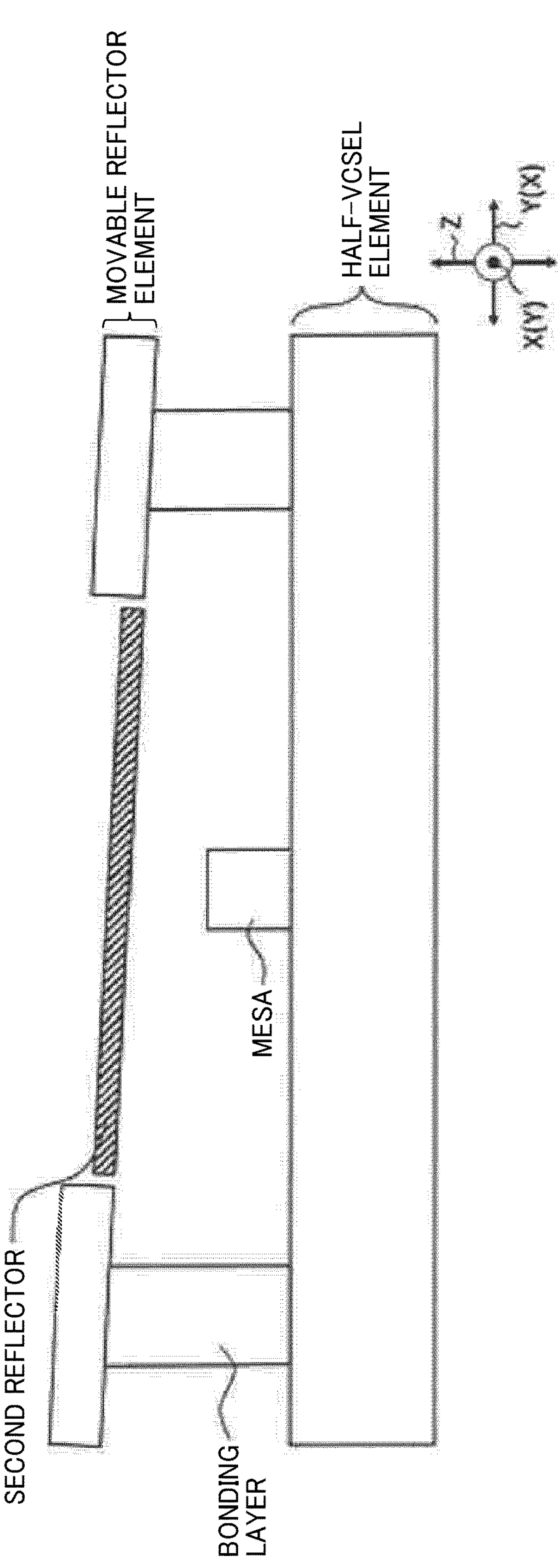
FIG. 28A is a cross-sectional view of a half-VCSEL element bonded with a movable reflector element with a tilt uncorrected.

FIG. 28A is a cross-sectional view of a movable reflector element and a half-VCSEL element, which are bonded together with the tilt uncorrected. The plane parallelism between the movable reflector element and the half-VCSEL element decreases partly because of an unevenness of the thickness of the bonding layer bonding the movable reflector element and the half-VCSEL element together. Such an unevenness in thickness occurs because the bonding layer already has an unevenness in thickness before bonding the movable reflector element and the half-VCSEL element together; or because heat or pressure applied to the movable reflector element, the half-VCSEL element, and the bonding layer during the bonding operation is unevenly distributed within a plane.

Figure 28B:
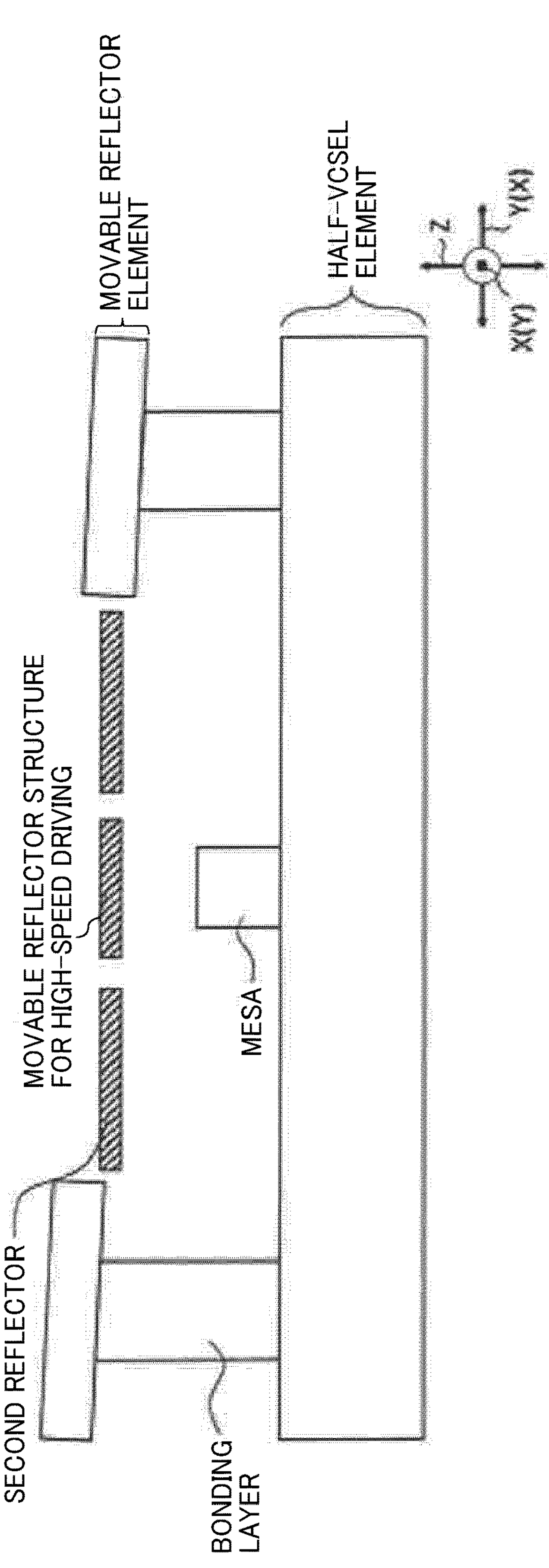
FIG. 28B is a cross-sectional view of a half-VCSEL element bonded with a movable reflector element with a second reflector and a movable reflector structure for high-speed driving.

FIG. 28B is a cross-sectional view of a half-VCSEL element and a movable reflector element provided with a second reflector and a movable reflector structure for high-speed driving, which are bonded together. As illustrated in FIG. 28A, driving the elastic support units, which support the second reflector, and the piezoelectric elements on the elastic support units using the independent drive signals improves the plane parallelism that has been degraded. With the voltage maintained, the movable reflector structure for high-speed driving is temporally driven using a modulation signal in a continuous manner. This reduces or eliminates the loss of light during the light reflection and also achieves a high-speed wavelength sweep.

Figure 29A:
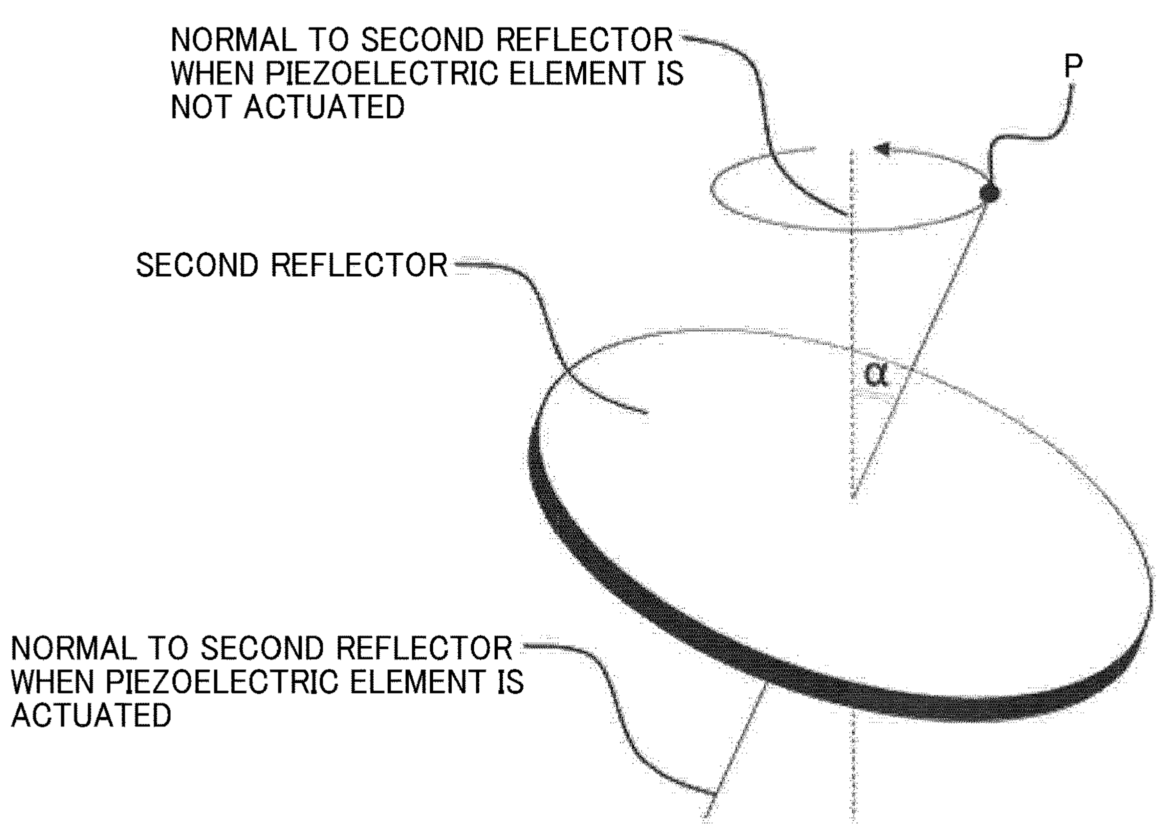
FIG. 29A is an illustration for describing adjustment of a tilt of the second reflector.

FIG. 29A is an illustration for describing adjustment of the tilt of the second reflector. A piezoelectric element on an elastic body connected to the second reflector is driven in accordance with a certain voltage signal, with respect to the normal to the second reflector (i.e., non-driving second reflector) that is not driven. In this case, the tilt a is created between the normal to the non-driving second reflector and the normal to the driving second reflector that is driven. Further, a point P on the straight line starting from the surface of the second reflector and along the direction of the normal to the non-driving second reflector changes its position according to the drive voltage applied to the piezoelectric element. For example, multiple piezoelectric elements are driven with independent voltage signals, and the tilt a and the position of the point P are controlled by changing the difference between relative or absolute values of the signals.

Figure 29B:
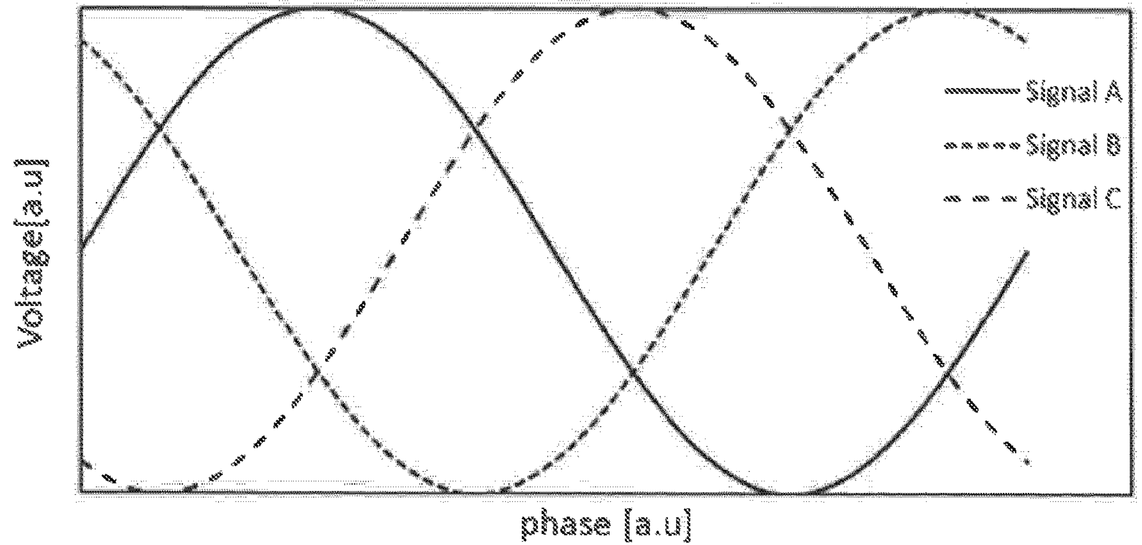
FIG. 29B is a graph of signals of voltage to be applied to the piezoelectric element.

FIG. 29B is a graph of the relation between the piezoelectric elements and the voltage signals applied to the piezoelectric elements. In this example, three piezoelectric elements are driven in accordance with signals A, B, and C, which are independent of each other. The three voltage values change with the phase in a sinusoidal manner. For example, the voltage signals A, B, and C are given by the following equations where phase_ini_A, phase_ini_B, and phase_ini_C are the initial phases for the signals A, B, and C, respectively, and Amp denotes an amplitude:

$$Voltage\_A=Amp*\sin(phase+phase\_ini\_A)$$

$$Voltage\_B=Amp*\sin(phase+phase\_ini\_B)$$

$$Voltage\_C=Amp*\sin(phase+phase\_ini\_C)$$

By giving a certain phase using the equations above, the voltage values of all the signals can be obtained. As the voltage value to be applied to a piezoelectric element is proportional to the displacement of the elastic body, the displacements of the elastic bodies can be unequal to each other by setting a certain phase. Accordingly, the tilt a and the position of the point P as illustrated in FIG. 29A can be controlled, and thus the tilt of the second reflector can be adjusted at a higher accuracy.

Figure 31:
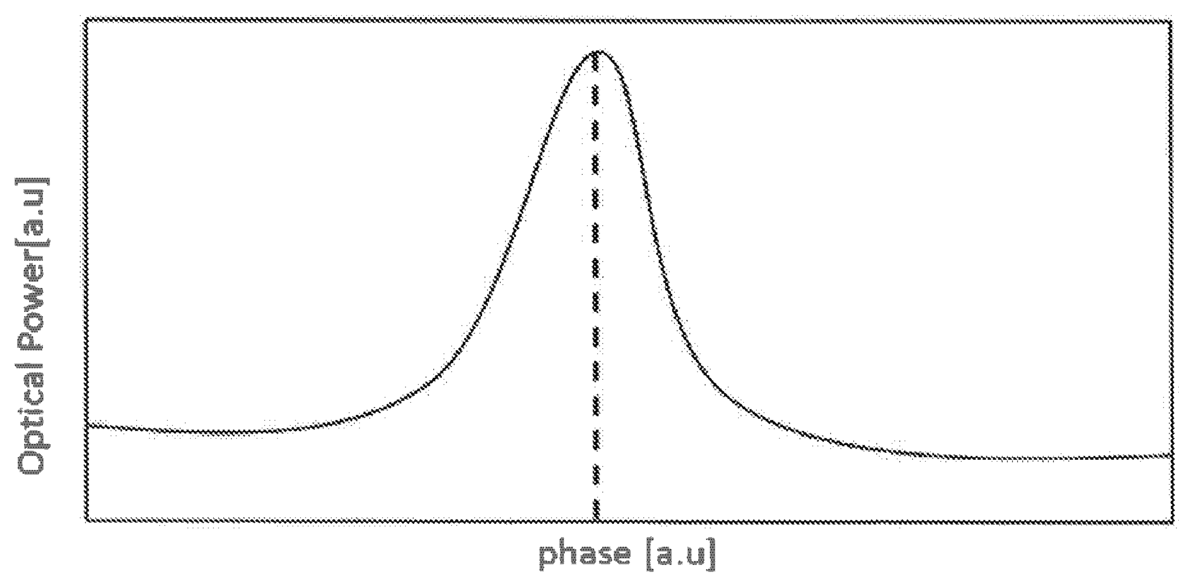
FIG. 31 is a graph of the relation between a phase of a drive-signal source during calibration and optical power of the tunable laser according to an embodiment of the present disclosure.

FIG. 30 is a block diagram of a configuration of calibration of the plane parallelism between the movable reflector element and the half-VCSEL element, according to an embodiment. FIG. 31 is a graph of the relation between a phase of a drive-signal source during calibration and optical power of the tunable laser, according to an embodiment.

The drive-signal source includes a voltage-signal source for driving the piezoelectric element in the movable reflector element constituting the tunable laser, and a current-signal source for injecting a current into the half-VCSEL element. When the above-described phase in the voltage signal source is swept in the voltage signal source while injecting a certain current into the half-VCSEL element, the tilt of the second reflector changes. At a certain tilt, the surfaces between the movable reflector element and the half-VCSEL element become infinitely close to parallel, and the loss of light during light reflection is reduced. When the loss of light is small, the intensity of naturally emitted or oscillation light emitted from the tunable laser increases. Accordingly, the light output intensity is maximized in a certain phase of the drive signal source.

Further, a photoelectric convertor generates a voltage according to the intensity of the incident light. The relation between the phase value and the optical output intensity is plotted using the phase value and voltage value of the drive source or the conversion constant (i.e., voltage generated with the unit optical output value) of the photoelectric convertor. Then, a phase condition for a high plane parallelism is determined by obtaining a phase value for which a voltage value or optical output value is maximum. Further, by adopting not only the optical output value but also the oscillation threshold current or the slope efficiency value used as the performance index of the tunable laser, calibration that can optimize each performance is possible. In addition, such a calibration is performed not only when the device using the tunable laser starts up, but also when external factors such as temperature, humidity, and atmospheric pressure change significantly, to drive the device while maintaining its performance.

For example, a temperature measuring device is disposed near a light source to measure the temperature of or near the tunable laser during its oscillation. A storage unit in FIG. 30 stores, as a correlation formula or a table, the relation between the wavelength, the output power, and the temperature of the tunable laser during oscillation, and also stores the relation between the drive voltage and the oscillation wavelength of the piezoelectric elements. The processor determines a correction voltage for which the oscillation wavelength is constant with temperature, or the output power becomes maximum, based on the relation between the temperature and the wavelength measured and stored in the storage unit. According to that voltage, a drive signal source drives a piezoelectric element.

As described above, the optical device of the present embodiment includes the first reflector, the second reflector, at least three elastic support units that support the second reflector, and piezoelectric elements provided the at least three elastic support units, respectively.

Then, by supplying independent drive signals to the piezoelectric elements of at least three elastic support units and elastically deforming at least three elastic support units independently, the plane parallelism of the first and second reflectors (alternatively, the plane parallelism between the light emitting portion and the second reflector) is changed.

By controlling the control portion using the piezoelectric drive independently, and by supporting the support unit and the mirror by the connecting portion provided with at least three or more of the drive portions, the tilt of the light emitting portion (e.g., the half-VCSEL element) and the mirror can be controlled freely.

This improves the plane parallelism of the two reflectors (the first and the second reflectors) or the plane parallelism of the light emitting portion (e.g., the half-VCSEL element) and the reflector (second reflector).

As a result, the threshold current of the light emitter decreases, and the light emitting intensity increases.

The present disclosure is not limited to the above-described embodiments, and can be modified in various ways.

The size, the shape, the function, and the like of the components illustrated in the accompanying drawings are not limited to the above embodiments, and can be appropriately changed within the effects of the present invention.

In addition, the size, the shape, the function, and the like of the components illustrated in the accompanying drawings can be appropriately modified and implemented as long as the size, the shape, the function, and the like of the components illustrated in the accompanying drawings does not deviate from the purpose of the present invention.

In the above embodiment, the case where three elastic support units for supporting the second reflector are provided apart from each other around the second reflector has been described as an example. There is a latitude in the number of elastic support units provided apart from each other, and various design changes are possible.

For example, four, five, or six or more elastic support units that support the second reflector may be provided around the second reflector (at least three may be provided).

In the above embodiment, at least three elastic support units are included, and each support unit has the meandering structure that includes two arms extending adjacent to each other and one folded portion connecting the ends on the same side of the two arms in the extending direction, and the piezoelectric elements are formed on the two arms.

In the above embodiment, at least three elastic support units are included, and each support unit has the meandering structure that may include three or more of arms extending adjacent to each other and two or more of folded portions each connecting the ends on the same side of two adjacent arms of the three or more of arms in the extending direction, and the piezoelectric elements may be formed on the three or more of arms.

In other words, each of at least three elastic support units has a plurality of the arms extending adjacent to each other and one or more folded portion each connecting the ends on the same side of two adjacent arms of the plurality of arms in the extending direction, and the piezoelectric elements are formed on at least three elastic support units, respectively.

In the above embodiment, the piezoelectric elements are provided so as not to be arranged in a direction orthogonal to the extending direction of the plurality of arms of at least three elastic support units.

The piezoelectric elements may be provided so as to be arranged in a direction orthogonal to the extending direction of the plurality of arms of at least three elastic support units.

In the above embodiment, the plurality of arms of at least three elastic support units include the displacement defining portions that do not elastically deform when a drive voltage is applied to the piezoelectric elements, wherein and the plurality of the displacement defining portions do not include the piezoelectric element among the plurality of arms.

The displacement defining portion with the piezoelectric element may be a portion where the drive voltage is not applied among the plurality of arms.

The present invention can be implemented in any convenient form, for example using dedicated hardware, or a mixture of dedicated hardware and software. The present invention may be implemented as computer software implemented by one or more networked processing apparatuses. The processing apparatuses include any suitably programmed apparatuses such as a general purpose computer, a personal digital assistant, a Wireless Application Protocol (WAP) or third-generation (3G)-compliant mobile telephone, and so on. Since the present invention can be implemented as software, each and every aspect of the present invention thus encompasses computer software implementable on a programmable device. The computer software can be provided to the programmable device using any conventional carrier medium (carrier means). The carrier medium includes a transient carrier medium such as an electrical, optical, microwave, acoustic or radio frequency signal carrying the computer code. An example of such a transient medium is a Transmission Control Protocol/Internet Protocol (TCP/IP) signal carrying computer code over an IP network, such as the Internet. The carrier medium also includes a storage medium for storing processor readable code such as a floppy disk, a hard disk, a compact disc read-only memory (CD-ROM), a magnetic tape device, or a solid state memory device.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), a digital signal processor (DSP), a field programmable gate array (FPGA), and conventional circuit components arranged to perform the recited functions.

This patent application is based on and claims priority to Japanese Patent Application No. 2020-093946, filed on May 29, 2020, Japanese Patent Application No. 2020-093949, filed on May 29, 2020, Japanese Patent Application No. 2021-079475, filed on May 10, 2021, and Japanese Patent Application No. 2021-079476, filed on May 10, 2021 in the Japan Patent Office, the entire disclosure of which are hereby incorporated by reference herein.

REFERENCE SIGNS LIST

10 Tunable laser (optical device)
100 Half-VCSEL element (light emitter, first substrate)
200 Movable reflector element (second substrate)
400 First reflector (first reflecting mirror)
800 Second reflector (second reflecting mirror)
900, 910, 920, 930 Elastic support unit
911, 921, 931 First arm
911B, 921B, 931B Displacement defining portion
913, 923, 933 Second arm
913B, 923B, 933B, 943B Displacement defining portion
912, 922, 932, 942 Folded portion
1000, 1010, 1011, 1013, 1020, 1021, 1023, 1030, 1011X, 1013X, 1021X, 1023X, 1031, 1033,
1041, 1043 Piezoelectric element
1200 Drive signal supply unit (drive voltage supply unit)

The invention claimed is:

1. An optical device comprising:
a first substrate including a light emitter including a first reflector and an active layer;
a second reflector facing the first reflector across the active layer;
an elastic support supporting the second reflector;
a stationary support having a rectangular frame shape to which the elastic support is connected;
a piezoelectric element on the elastic support;
a second substrate including a movable reflector in which at least the elastic support and the stationary support share a common layer;
a bonding layer that bonds the stationary support to the light emitter; and
circuitry configured to output a signal to apply drive voltage to the piezoelectric element to elastically deform the elastic support,
wherein the deformation of the elastic support moves the second reflector relative to the first reflector to oscillate light from the light emitter.

2. The optical device according to claim 1, wherein:
the second substrate includes a plurality of light emitters.

3. The optical device according to claim 1, wherein the elastic support includes:
multiple arm portions extending adjacent to each other; and
one or more folded portions each connecting ends on the same side of two adjacent arm portions of the arm portions in an extending direction of the arm portions,
wherein the piezoelectric element includes multiple piezoelectric elements, and the piezoelectric elements are on the arm portions, respectively.

4. The optical device according to claim 3, wherein:
the piezoelectric elements are disposed along a direction orthogonal to the extending direction of the arm portions.

5. The optical device according to claim 3, wherein:
the piezoelectric elements are displaced from each other in the extending direction of the arm portions.

6. The optical device according to claim 3, wherein:
the arm portions include displacement defining portions, and the displacement defining portions are elastically undeformable in response to application of the drive voltage to the piezoelectric elements.

7. The optical device according to claim 6, wherein:
the displacement defining portions are without the piezoelectric elements.

8. The optical device according to claim 6, wherein:
the displacement defining portions include the piezoelectric element, to which the drive voltage is not applied.

9. The optical device according to claim 1, wherein; the deformation of the elastic support changes a distance between the first reflector and the second reflector to change an oscillation wavelength of the light emitted from the light emitter.

10. The optical device according to claim 1, wherein: the elastic support includes at least two elastic supports, and the at least two elastic supports are apart from each other around the second reflector.

11. The optical device according to claim 1, wherein: the elastic support includes at least three elastic supports each including the piezoelectric element, the circuitry is further configured to output drive signals independent of each other to the piezoelectric elements of the at least three elastic supports, respectively, to deform the at least three elastic supports elastically and independently of each other, and the deformation of the at least three elastic supports changes plane parallelism between the first reflector and the second reflector.

12. The optical device according to claim 11, wherein: the circuitry is further configured to output the drive signals independent of each other to the piezoelectric elements of the at least three elastic supports, respectively, based on a tilt of the second reflector with respect to the first reflector, to deform the at least three elastic supports elastically and independently of each other, and the deformation of the at least three elastic supports increases the plane parallelism between the first reflector and the second reflector.

13. The optical device according to claim 11, wherein: based on intensity of the light emitted from the light emitter, the circuitry is further configured to output the drive signals independent of each other to the piezoelectric elements of the at least three elastic supports, respectively, to deform the at least three elastic supports elastically and independently of each other, and the deformation of the at least three elastic supports increases the intensity of the light emitted from the light emitter.

14. The optical device according to claim 11, wherein; each of the at least three elastic supports includes multiple arm portions extending adjacent to each other; and one or more folded portions each connecting ends on the same side of two adjacent arm portions of the arm portions in an extending direction of the arm portions, and the piezoelectric element includes multiple piezoelectric elements, and the piezoelectric elements are on the arm portions of the at least three elastic supports.

15. The optical device according to claim 14, wherein: the piezoelectric elements are not arranged along a direction orthogonal to the extending direction of the arm portions of the at least three elastic supports.

16. The optical device according to claim 14, wherein: the arm portions include displacement defining portions, and the displacement defining portions are elastically undeformable in response to application of drive voltage to the piezoelectric elements.

17. The optical device according to claim 16, wherein: the displacement defining portions are without the piezoelectric elements.

18. The optical device according to claim 11, wherein: the at least three elastic supports are apart from each other around the second reflector.

19. The optical device according to claim 1, wherein: the first substrate further includes a semiconductor substrate and an antireflection film, and the first reflector is laminated on the semiconductor substrate.

20. The optical device according to claim 3, wherein: the piezoelectric elements are arranged at different positions displaced from each other in the extending direction of the arm portions.

* * * * *